United States Patent [19]
Orii et al.

[11] Patent Number: 5,559,464
[45] Date of Patent: Sep. 24, 1996

[54] SIGNAL VOLTAGE LEVEL CONVERSION CIRCUIT AND OUTPUT BUFFER CIRCUIT

[75] Inventors: Toshio Orii; Masahiro Kanai, both of Suwa, Japan

[73] Assignee: Seiko Epson Corporation, Japan

[21] Appl. No.: 271,331

[22] Filed: Jul. 6, 1994

[30]   Foreign Application Priority Data

Jul. 6, 1993  [JP]  Japan ................... 5-167116
May 9, 1994  [JP]  Japan ................... 6-095297

[51] Int. Cl.[6] .............................. H03L 5/00; H03K 1/175
[52] U.S. Cl. ................... 327/333; 326/80; 326/81
[58] Field of Search ................... 327/333, 387, 327/389, 391, 12, 57, 64, 76, 97; 326/62, 80, 81, 83

[56]         References Cited

U.S. PATENT DOCUMENTS

| | | | |
|---|---|---|---|
| 4,707,622 | 11/1987 | Takao et al. | 326/83 |
| 5,113,097 | 5/1992 | Lee | 326/81 |
| 5,136,190 | 8/1992 | Chern et al. | 326/81 |
| 5,144,165 | 9/1992 | Dhong et al. | 326/80 |
| 5,204,557 | 4/1993 | Nguyen | 326/81 |
| 5,399,915 | 3/1995 | Yahata | 327/108 |
| 5,436,585 | 7/1995 | DiMarco | 327/333 |

FOREIGN PATENT DOCUMENTS 547192  2/1993  Japan .

Primary Examiner—David C. Nelms
Assistant Examiner—Trong Phan
Attorney, Agent, or Firm—Harold T. Tsiang

[57]         ABSTRACT

A signal voltage level conversion circuit has a configuration in which all transistors can be produced, during the semiconductor fabrication process, so that their gate-source, gate-drain, and gate-substrate voltages are within the 3v voltage tolerance range. The signal voltage level conversion circuit converts input signals with a narrow logical amplitude of 0~3v to output signals with a wide logical amplitude of 0~5v. The input signal Vin, 0~3v, is temporarily converted into a mediator signal Vm, approximately 3~5v by a mediator signal generation circuit. An output buffer circuit then converts mediator signal Vm to output signal Vout of 0~5v. In the mediator signal generation circuit and the output buffer circuit, application of voltage is relaxed on a plurality of transistors, so that all transistors are maintained within the 3v voltage tolerance range.

38 Claims, 14 Drawing Sheets

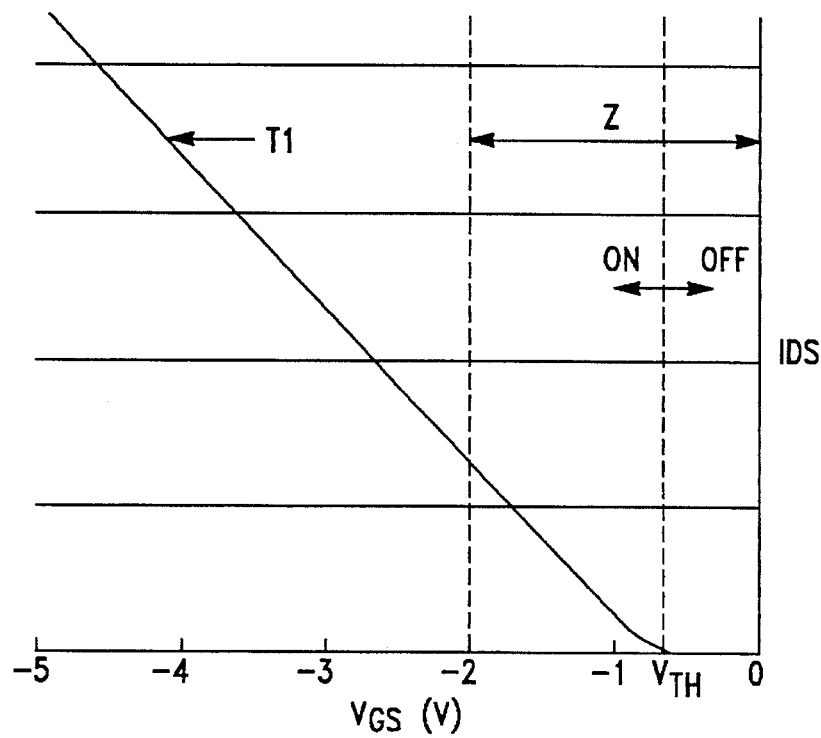
FIG.—11A
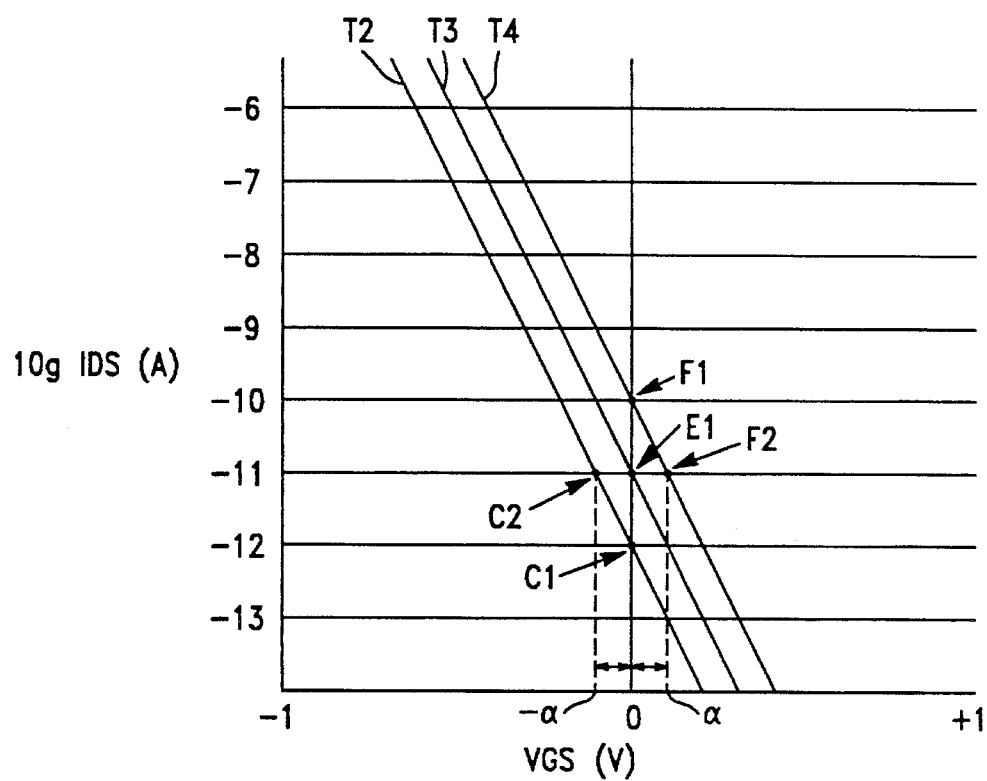
FIG.—11B

SIGNAL VOLTAGE LEVEL CONVERSION CIRCUIT AND OUTPUT BUFFER CIRCUIT

BACKGROUND OF THE INVENTION

This invention concerns a signal voltage level conversion circuit (level shifter) that converts input signals with a source signal waveform that has a narrow logical amplitude, e.g. 0~3 v, into output signals with a wide logical amplitude, e.g., 0~5 v; it also concerns an output buffer circuit.

In logic LSI using sub-micron semiconductor microfabrication processes, the power supply voltage for internal circuits is reduced to the 3-v level, such as 3 v and 3.3 v, in order to achieve greater reliability and low power consumption. During the transition from the currently dominant 5 v to the future 3 v level, the issue that confronts system design work is that of how to reconcile the signal I/O levels between 3 v units and the 5 v chips, given that the use of 5 v chips will continue in the peripheral LSI units. For example, when a signal, obtained in a 3 v circuit and having a narrow logical amplitude, is to be processed in a 5 v circuit system, a signal voltage level conversion circuit (level shifter) will be required that converts the input signal, with a 3 v narrow logic amplitude, to a 5 v logic amplitude (in the 0~5 v range).

A conceivable signal voltage level conversion circuit is a flip-flop circuit configuration made by linking two low-power consumption CMOS transistors, shown in FIG. 14, and by providing feedback. Specifically, the signal voltage level conversion circuit shown in FIG. 14 is switching-controlled by the CMOS inverter (1) (inverse signal generation circuit) that generates an inverted signal Vin (bar) with a narrow logical amplitude, 0~3 v, by use of the input signal Vin with a narrow logical amplitude, 0~3 v; a first MOS transistor Q1 (N-type transistor) that is switching-controlled by the input signal Vin; a second MOS transistor $Q_2$ (N-type transistor) that is switching-controlled by the inverted signal $V_{in}$ (bar) and that turns on and off on a mutually exclusive basis with the first MOS transistor $Q_1$; a third MOS transistor $Q_3$ (P-type transistor) that is serially connected to the second MOS transistor $Q_2$ and whose "on" operation is controlled by the "on" action of the first MOS transistor $Q_1$; and a fourth MOS transistor $Q_4$ (P-type transistor) that is serially connected to the first MOS transistor Q1 and whose "on" operation is controlled by the "on" action of the second MOS transistor Q2. The third and fourth MOS transistors, $Q_3$, and $Q_4$, compose a flip-flop (FF) (bi-stable circuit) that has mutually exclusive logical input points (nodes), $N_1$, and $N_2$, by means of a feedback loop. While the first MOS transistor $Q_1$ is an electric potential transmission gate for the side that sends low-level (0 v) logic values to the node $N_1$ by means of the input signal $V_{in}$, the second MOS transistor $Q_2$ functions as the other electric potential transmission gate that sends low-level (0 v) logic values to the node $N_2$ by means of an inverted signal $V_{in}$ (bar). Both the first and fourth MOS transistors $Q_1$ and $Q_4$ are CMOS transistors. Their common drain is connected as node $N_1$ to the gate electrode G of the third MOS transistor $Q_3$. Similarly, the second and third MOS transistors $Q_2$ and $Q_3$ are CMOS transistors. Their common drain is connected as node $N_2$ to the gate electrode G of the fourth MOS transistor $Q_4$. The input signal Vin is applied to the gate electrode G of the first MOS transistor $Q_1$, and the inverse signal $V_{in}$ (bar) is applied to the gate electrode G of the second MOS transistor $Q_2$. Then, the output signal Vout is obtained from the other node $N_2$.

When the input signal Vin reaches the high level at 3 v, the first MOS transistor $Q_1$ is turned on. Because the inverted signal Vin (bar) is at the low level of 0 v, the second MOS transistor $Q_2$ is off. When the first MOS transistor $Q_1$ is turned on, the 0 v electric potential (ground potential) is transmitted to the node $N_1$ of the flip-flop FF. Therefore, the 0 v electric potential is applied to the gate electrode G of the third MOS transistor $Q_3$. Therefore, the third MOS transistor $Q_3$ is turned on, and the output signal Vout of the node $N_2$, the drain electrode for the third MOS transistor $Q_3$, is maintained at the high level of 5 v. When this output signal Vout is at the high level, the fourth MOS transistor $Q_4$ is off. Thus, when the input signal $V_{in}$ for the 3 v system is at the high level (3 v), the output signal for the 5 v system reaches the high level (5 v). On the other hand, when the input signal Vin is at the low level of 0 v, the first MOS transistor $Q_1$ is turned off. When this happens, the inverted signal $V_{in}$ (bar) becomes the high level, thus causing the second MOS transistor $Q_2$ to be turned on. When the second MOS transistor $Q_2$ is on, an 0 v electric potential is transmitted to the node $N_2$ of the flip-flop FF. Therefore, an 0 v electric potential is applied to the gate electrode G of the fourth MOS transistor $Q_4$. This causes the fourth MOS transistor $Q_4$ to be turned off and the node $N_1$ to reach the high level. This causes the third MOS transistor $Q_3$ to be off. Consequently, the output signal $V_{out}$ remains at the low level of 0 v.

However, in the configuration of a signal voltage level conversion circuit as shown in FIG. 14, when the input signal $V_{in}$ is at the high level, a 5 v electric potential is applied to the terminals between the MOS transistors $Q_2$, $Q_3$, and $Q_4$. Similarly, when the input signal $V_{in}$ is at the low level, a 5 v electric potential is applied to the terminals between the MOS transistors $Q_1$, $Q_3$, and $Q_4$. Therefore, the MOS transistors $Q_1$~$Q_4$ must be able to withstand a 5 v voltage between gate and source, between gate and drain, and between gate and substrate. Thus, whereas the MOS transistors $Q_5$ and $Q_6$ for the CMOS inverter (1) need only to withstand a 3 v voltage level, the MOS transistors $Q_1$~$Q_4$ break down if they are capable of withstanding only 3 v (gate insulator damage). This requires the use of additional fabrication processes to incorporate conventional 5 v-tolerant MOS transistors. This detracts from the progress of microfabrication processes. Because the semiconductor fabrication process for signal voltage level conversion circuits requires MOS transistors of different voltage tolerance capacities, this requires an increase in the number of fabrication processes and in complexity. This has hampered efforts to achieve cost reductions.

Therefore, a purpose of the present invention is to solve the above problems. One of its objectives is to provide a signal voltage level conversion circuit that can reduce the voltage tolerance requirements of all MOS (MIS) transistors in order to achieve a reduction in the number of semiconductor processes that are required. Another objective of the present invention is to provide an output buffer circuit that can be used appropriately in conjunction with the signal voltage level conversion circuit.

SUMMARY OF THE INVENTION

To solve the above problems this invention adopts two fundamental means as described below. The first fundamental means uses a signal voltage level conversion circuit that comprises the following components: a first, first conductivity-type MIS transistor ($Q_1$) whose on and off actions are controlled by a narrow logical amplitude input signal defined by the first low level and the first high level; a second, first conductivity-type MIS transistor ($Q_2$) whose on and off actions are controlled exclusively with respect to the first, first conductivity-type MIS transistor by means of the inverted signal of the input signal; a first, second conductivity-type MIS transistor ($Q_3$) which is boosted by means of a high-voltage power supply serially with respect to the second, first conductivity-type MIS transistor ($Q_2$), whose "on" action is controlled by means of the "on" operation of the first, first conductivity-type MIS transistor ($Q_1$) and whose "off" operation is controlled on the basis of the "on" operation on the second, first conductivity-type MIS transistor ($Q_2$); a second, second conductivity-type MIS transistor ($Q_4$) which is boosted by means of the high-voltage power supply serially with respect to the first, first conductivity-type MIS transistor ($Q_1$), whose "on" action is controlled by the "on" operation of the second, first conductivity-type MIS transistor ($Q_2$) and whose "off" operation is controlled on the basis of the "on" operation of the first, first conductivity-type MIS transistor ($Q_1$); such that the first and second conductivity-type MIS transistors are composed of a flip-flop (FF) with a feedback loop; such that the conductivity-type MIS transistor is characterized in that it exists serially between the first, first conductivity-type MIS transistor ($Q_1$) and the second, second conductivity-type MIS transistor ($Q_4$) and is boosted by means of a low-voltage power supply; such that the signal voltage level conversion circuit contains a first voltage application relaxation means ($Q_{11}$, $Q_{31}$) that exists serially between the first, first conductivity-type MIS transistor ($Q_1$) and the second, second conductivity-type MIS transistor ($Q_4$) and which is boosted by means of a low-voltage power supply and that relaxes the application of voltage to either the first, first conductivity-type MIS transistor ($Q_1$) or the second, second conductivity-type MIS transistor ($Q_4$), whichever transistor is "off"; and a second voltage application relaxation means ($Q_{21}$, $Q_{41}$) that exists serially between the second, first conductivity-type MIS transistor ($Q_2$) and the first, second conductivity-type MIS transistor ($Q_3$) and which is boosted by means of a low-voltage power supply and that relaxes the application of voltage to either the second, first conductivity-type MIS transistor ($Q_2$) or the first, second conductivity-type MIS transistor ($Q_3$), whichever transistor is "off".

In this case the above voltage application relaxation means ($Q_{11}$, $Q_{31}$) is a complementary MIS inverter composed of a third, first conductivity-type MIS transistor ($Q_{11}$) and a third, second conductivity-type MIS transistor ($Q_{31}$), both of which receive the voltage from the low-voltage power supply as a gate voltage; such that the third, first conductivity-type MIS transistor ($Q_{11}$) is serially connected and is adjacent to the first, first conductivity-type MIS transistor ($Q_1$), and the third, second conductivity-type MIS transistor ($Q_{11}$) is serially connected and is adjacent to the second, second conductivity-type MIS transistor ($Q_4$) such that the second voltage application relaxation means ($Q_{21}$, $Q_{41}$) is a complementary MIS inverter composed of a fourth, first conductivity-type MIS transistor ($Q_{21}$) and a fourth, second conductivity-type MIS transistor ($Q_{41}$), both of which receive the voltage from the low-voltage power supply as a gate voltage, such that the fourth conductivity-type MIS transistor ($Q_{21}$) is serially connected and is adjacent to the second, first conductivity-type MIS transistor ($Q_2$), and the fourth, second conductivity-type MIS transistor ($Q_{41}$) is serially connected and is adjacent to the second, first conductivity-type MIS transistor ($Q_3$).

The second fundamental means uses a signal voltage level conversion circuit comprising the following: a first, first conductivity-type MIS transistor ($Q_1$) whose on and off actions are controlled by a narrow logical amplitude input signal defined by the first low level and the first high level; a second, first conductivity-type MIS transistor ($Q_2$) whose on and off actions are controlled exclusively with respect to the first, first conductivity-type MIS transistor ($Q_1$) by means of the inverted signal of the input signal; a first, second conductivity-type MIS transistor ($Q_3$) which is boosted by means of a high-voltage power supply serially with respect to the second, first conductivity-type MIS transistor ($Q_2$) whose "on" action is controlled by means of the "on" operation of the first, first conductivity-type MIS transistor ($Q_1$) and whose "off" operation is controlled on the basis of the "on" operation of the second, first conductivity-type MIS transistor $Q_2$; a second, second conductivity-type MIS transistor ($Q_4$) which is boosted by means of the high-voltage power supply serially with respect to the first, first conductivity-type MIS transistor ($Q_1$) whose "on" action is controlled by means of the "on" operation of the second, first conductivity-type MIS transistor ($Q_2$) and whose "off" operation is controlled on the basis of the "on" operation of the first, first conductivity-type MIS transistor ($Q_1$); such that the signal voltage level conversion circuit is characterized in that it includes the following: a first voltage application relaxation means ($Q_{11}$, $Q_{31}$), which exists serially between the first, first conductivity-type MIS transistor ($Q_1$) and the second, second conductivity-type MIS transistor ($Q_4$) and is boosted by means of a low-voltage power supply, and which relaxes the application of voltage to either the first, first conductivity-type MIS transistor ($Q_1$) or the second, second conductivity-type MIS transistor ($Q_4$), whichever is in the "off" state; a second voltage application relaxation means ($Q_{21}$, $Q_{41}$), which exists serially between the second, first conductivity-type MIS transistor ($Q_2$) and the first, second conductivity-type MIS transistor ($Q_3$) and is boosted by means of a low-voltage power supply, and which relaxes the application of voltage to either the second, first conductivity-type MIS transistor ($Q_2$) or the first, second conductivity-type MIS transistor ($Q_3$), whichever is in the "off" state; a third voltage application relaxation means ($Q_{51}$, 8a), which is boosted by the low-voltage power supply and which relaxes the application of voltage to the gate electrode of the first, second conductivity-type MIS transistor $Q_3$ when the first, first conductivity-type MIS transistor ($Q_1$) is in the "on" state; and a fourth voltage application relaxation means ($Q_{61}$, 8b), which is boosted by the low-voltage power supply and which relaxes the application of voltage to the gate electrode of the second, second conductivity-type MIS transistor ($Q_4$) when the second, first conductivity-type MIS transistor ($Q_2$) is in the "on" state.

In this case the first voltage application relaxation means ($Q_{11}$, $Q_{31}$) is a complementary MIS inverter composed of a third, first conductivity-type MIS transistor ($Q_{11}$) and a third, second conductivity-type MIS transistor ($Q_{31}$), both of which receive the voltage from the low-voltage power supply as a gate voltage; such that the third, first conductivity-type MIS transistor ($Q_{11}$) is serially connected and is adjacent to the first, first conductivity-type MIS transistor ($Q_1$), and the third, second conductivity-type MIS transistor ($Q_{31}$) is serially connected and is adjacent to the second, second conductivity-type MIS transistor ($Q_4$); such that the second voltage application relaxation means ($Q_{21}$, $Q_{41}$) is a complementary MIS inverter composed of a fourth, first conductivity-type MIS transistor ($Q_{21}$) and a fourth, second conductivity-type MIS transistor ($Q_{41}$), both of which receive the voltage from the low-voltage power supply as a gate voltage, such that the fourth, first conductivity-type MIS transistor ($Q_{21}$) is serially connected and is adjacent to the second, first conductivity-type MIS transistor ($Q_2$), and the fourth, second conductivity-type MIS transistor ($Q_{41}$) is serially connected and is adjacent to the first, second conductivity-type MIS transistor ($Q_3$); the third voltage application relaxation means ($Q_{51}$, 8a) is a complementary MIS inverter composed of a fifth, second conductivity-type MIS transistor ($Q_{51}$) that receives the voltage from the aforementioned low-voltage supply as a gate voltage and that exists between the gate electrodes of the third, first conductivity-type MIS transistor ($Q_{11}$) and the first, second conductivity-type MIS transistor ($Q_3$), and a first constant-current source (8a) that passes a small amount of current to it; and the fourth voltage application relaxation means is composed of a sixth, second conductivity-type MIS transistor ($Q_{61}$) that receives the voltage from the aforementioned low-voltage supply as a gate voltage and that exists between the gate electrodes of the fourth, first conductivity-type MIS transistor ($Q_{21}$) and the second, second conductivity-type MIS transistor ($Q_4$), and a first constant-current source (8b) that passes a small amount of current to it.

The first and second constant-current sources, as identified above, can be either diode circuits composed of serial connections of sub-threshold-state junction diodes or MIS transistor circuits composed of serial connections of negative-load MIS transistors.

In the fundamental means 1 and 2 identified above it is desirable to provide the following: a first lower bound limiting means (5a) that controls the fall in the junction-point electric potential of the second, second conductivity-type MIS transistor ($Q_4$) and the third, second conductivity-type MIS transistor ($Q_{31}$); and a second lower bound limiting means (5b) that controls the fall in the junction-point electric potential of the first, second conductivity-type MIS transistor ($Q_3$) and the fourth, second conductivity-type MIS transistor ($Q_{41}$). It is also desirable to provide a first upper bound limiting means (5c) that controls the rise in the junction-point electric potential of the first, first conductivity-type MIS transistor ($Q_1$) and the third, first conductivity-type MIS transistor ($Q_{11}$); and a second upper bound limiting means (5d) that controls the rise in the junction-point electric potential of the second, first conductivity-type MIS transistor ($Q_2$) and the fourth, first conductivity-type MIS transistor ($Q_{21}$). The third, second conductivity-type MIS transistor ($Q_{31}$) and the fourth, second conductivity-type MIS transistor ($Q_{41}$), as well as the third, first conductivity-type MIS transistor ($Q_{11}$) and the fourth, first conductivity-type MIS transistor ($Q_{21}$) can be set in a state in which a substrate bias is applied. It is desirable to provide a low-voltage power backup means (4) that produces a low voltage from the high-voltage power supply between the high-voltage power supply line and the low-voltage power supply line. The low-voltage power supply backup means is a voltage-fall circuit that can be, for example, a voltage-fall circuit that is formed by the serial connection of several junction diodes (4a, 4b, and 4c).

For the signal voltage level conversion circuit of the above configuration this invention can also adopt a configuration in which the following output buffer circuit (2) is provided: the signal voltage level conversion circuit including an output buffer circuit (2), a first conductivity-type MIS transistor ($Q_7$) for the transmission of a low-level electric potential of the high-voltage power supply whose on and off actions are controlled by receiving, as a first input signal, either the input signal or the reversed signal; a second conductivity-type MIS transistor ($Q_8$) for the transmission of a high-level electric potential of the high-voltage power supply whose on and off actions are controlled by receiving, as a second input signal, the gate voltage of either the first, second conductivity-type MIS transistor ($Q_3$) or the second, second conductivity-type MIS transistor ($Q_4$); and a fifth voltage application relaxation means ($Q_{71}$, $Q_{81}$) that exists serially between the first conductivity-type MIS transistor ($Q_7$) for the transmission of the low-level electric potential and the second conductivity-type MIS transistor for the transmission of the high-level electric potential and is boosted by the low-level voltage, and that relaxes the application of voltage to either the first conductivity-type MIS transistor ($Q_7$) for the transmission of the low-level electric potential and the second conductivity-type MIS transistor ($Q_8$) for the transmission of the high-level electric potential, whichever is in the off state. The fifth voltage application relaxation means ($Q_{71}$, $Q_{81}$) is a complementary MIS inverter composed of a fifth, first conductivity-type MIS transistor ($Q_{71}$) and a seventh, second conductivity-type MIS transistor ($Q_{81}$), both of which receive the voltage from the low-voltage power supply as a gate voltage; such that the fifth, first conductivity-type MIS transistor ($Q_{71}$) is connected serially and is adjacent to the first conductivity-type MIS transistor ($Q_7$) for the transmission of the low-level electric potential and the seventh, second conductivity-type MIS transistor ($Q_{81}$) is connected serially and is adjacent to the second conductivity-type MIS transistor ($Q_8$) for the transmission of the high-level electric potential.

Preferably the signal voltage level conversion circuit including this type of output buffer circuit should be provided with a timing circuit (5) that outputs the first input signal by delaying the phases of either the input signal or the reversed signal relative to the second input signal. Further, a sixth voltage application relaxation means ($Q_{91}$, 8c) that generates the aforementioned second input signal instead of the gate voltage for either the first, second conductivity-type MIS transistor ($Q_3$) or the second, second conductivity-type MIS transistor ($Q_4$), and that relaxes the application of voltage to the gate electrode of the second conductivity-type MIS transistor ($Q_8$) for the transmission of high-level electric potential. The sixth voltage application relaxation means comprises of the following for example: an eighth, second conductivity-type MIS transistor ($Q_{91}$) that receives the voltage from the low-voltage power supply as a gate voltage and that is serially connected to either the third, first conductivity-type MIS transistor ($Q_{11}$) or the fourth, first conductivity-type MIS transistor ($Q_{21}$), and a third constant-current source (8c) that passes a small amount of current to it. The constant-current source (8c) is a diode circuit composed of a serial connection of junction diodes in a sub-threshold state.

And a lower-bound limiting means (6b) that inhibits the fall in the junction point electric potential for the seventh, second conductivity-type MIS transistor ($Q_{81}$) and the second conductivity-type MIS transistor ($Q_8$) for the transmission of high-level electric potential can be provided. Similarly, an upper-bound limiting means (6a) that inhibits the rise in the junction point electric potential for the fifth, first conductivity-type MIS transistor ($Q_{71}$) and the first conductivity-type MIS transistor ($Q_7$) for the transmission of low-level electric potential can be provided.

The aforementioned output buffer circuit by itself performs the signal voltage level conversion function. Specifically, the output buffer circuit (2) is characterized in that it includes the following: a first conductivity-type MIS transistor ($Q_7$) for the low-level electric potential transmission of a high-voltage power supply whose on and off actions are controlled by a narrow logical amplitude input signal defined by the first low level and the first high level; a second conductivity-type MIS transistor ($Q_8$) for the high-level electric potential transmission of the high-voltage power supply whose on and off actions are controlled by a second, narrow logical amplitude input signal, which is received as a second signal and which is defined by a second low level higher than the first low level, and a second high level higher than the first high level; and a first voltage application relaxation means ($Q_{71}$, $Q_{81}$) that exists serially between the first conductivity-type MIS transistor ($Q_7$) for the transmission of low-level electric potential and the second conductivity-type MIS transistor ($Q_8$) for the transmission of high-level electric potential, that is boosted by a low-voltage power supply, and that relaxes the application of voltage to either the first conductivity-type MIS transistor for the transmission of low-level electric potential or the second conductivity-type MIS transistor for the transmission of high-level electric potential, whichever is in the off state.

The first voltage application relaxation means is a complementary MIS inverter composed of a first, first conductivity-type MIS transistor ($Q_{71}$) and a first, second conductivity-type MIS transistor ($Q_{81}$), both of which receive the voltage from the low-voltage power supply as a gate voltage; such that the first, first conductivity-type MIS transistor ($Q_{71}$) is serially connected and is adjacent to the first conductivity-type MIS transistor ($Q_7$) for the transmission of low-level electric potential, and that the first, second conductivity-type MIS transistor ($Q_{81}$) is serially connected and is adjacent to the second conductivity-type MIS transistor ($Q_8$) for the transmission of high-level electric potential. It is also desirable to provide a second voltage application relaxation means ($Q_{91}$, 8c) that relaxes the application of voltage to the gate electrode for the second conductivity-type MIS transistor $Q_8$ for the transmission of high-level electric potential. The second voltage application relaxation means ($Q_{91}$, 8c) includes a second, second conductivity-type MIS transistor ($Q_{91}$) that receives the voltage from the low-voltage power supply as a gate voltage and uses it as an input for the second input signal, and a constant-current source (8c) that passes a small amount of current to it. The constant-current source can be a diode circuit composed of a serial connection of junction diodes in a sub-threshold state. A lower-bound limiting means (6b) can be provided that inhibits a fall in the junction point electric potential between the first, second conductivity-type MIS transistor ($Q_{81}$) and the second conductivity-type MIS transistor ($Q_8$) for the transmission of high-level electric potential. Similarly, an upper-bound limiting means (6a) can be provided that inhibits a rise in the junction point electric potential between the first, first conductivity-type MIS transistor ($Q_{71}$) and the first conductivity-type MIS transistor ($Q_7$) for the transmission of low-level electric potential. The first, second conductivity-type MIS transistor ($Q_{71}$) and/or the first, first conductivity-type MIS transistor ($Q_{81}$) can be in a state in which a substrate bias is applied.

In the fundamental means for the first flip-flop type, when the first, first conductivity-type MIS transistor ($Q_1$) is turned on, the second, second conductivity-type MIS transistor ($Q_2$) is turned off, and the first, second conductivity-type MIS transistor ($Q_3$) is turned on, and the second, second conductivity-type MIS transistor ($Q_4$) is turned off. Because the first voltage application relaxation means, while relaxing the voltage application to the second, second conductivity-type MIS transistor, applies the relaxed voltage to the gate of the first, second conductivity-type MIS transistor, and the second voltage application relaxation means relaxes the voltage application to the second, first conductivity-type MIS transistor. On the other hand, when the second, first conductivity-type MIS transistor is turned on, the first, first conductivity-type MIS transistor is turned off, and when the second, second conductivity-type MIS transistor is turned on, the first, second conductivity-type MIS transistor is turned off. However, this time the second voltage application relaxation means, while relaxing the voltage application to the first, second conductivity-type MIS transistor, applies the relaxed voltage to the gate of the second, second conductivity-type MIS transistor, and the first voltage application relaxation means relaxes the voltage application to the first, first conductivity-type MIS transistor. Thus, because the voltage applied to the transistors is relaxed by the first and second voltage application relaxation means, all the transistors used in the signal voltage level conversion circuit are within the low-voltage tolerance range. This simplifies the semiconductor fabrication process and makes it possible to provide low-cost signal voltage level conversion circuits.

The second fundamental means, in contrast to the first fundamental means, is of a non-flip-flop configuration. When the first, first conductivity-type MIS transistor ($Q_1$) is turned on, the second, first conductivity-type MIS transistor ($Q_2$) is turned off. When the first, first conductivity-type MIS transistor is turned on, the first, second conductivity-type MIS transistor ($Q_3$) is turned on, and when the second, first conductivity-type MIS transistor is turned off, the second, second conductivity-type MIS transistor ($Q_4$) is turned off. However, unlike the first fundamental means, the second fundamental means does not include a voltage application relaxation means that relaxes the voltage on both the first and second conductivity-type MIS transistors. Instead, the third voltage application relaxation means operates on the first, second conductivity-type MIS transistor, and the fourth voltage application relaxation means operates on the second, second conductivity-type MIS transistor, each one independently. This type of individual voltage relaxation method permits the setting of an optimal voltage for each transistor. In this case, the third voltage application relaxation means can be composed of a fifth, second conductivity-type MIS transistor ($Q_{51}$) that receives the voltage from the aforementioned low-voltage power supply as a gate voltage and that exists between the gate electrodes of the third, first conductivity-type MIS transistor ($Q_{11}$) and the first, second conductivity-type MIS transistor ($Q_3$), and a first constant-current source (8a) that passes a small amount of current to it. Similarly, the fourth voltage application relaxation means can be composed of a sixth, second conductivity-type MIS transistor ($Q_{61}$) that receives the voltage from the aforementioned low-voltage power supply as a gate voltage and that exists between the gate electrodes of the fourth, first conductivity-type MIS transistor $Q_{21}$ and the second, second conductivity-type MIS transistor ($Q_4$), and a second constant-current source (8b) that passes a small amount of current to it. When these first and second constant-current sources are made with diode circuits composed of serial connections of junction diodes in a sub-threshold state, the voltage relaxation can be regulated in terms of the sub-threshold current and the transistor leak current. The fact that the sub-threshold current value can be determined by the number of diodes permits accurate control.

In cases where the same logic value remains for a long time, the leak current can cause a rise or fall in the voltage levels. However, by providing either a lower-bound limiting means or an upper-bound limiting means, these fluctuations in level can be kept in a specified value. In this manner the transistors can always be kept at a low voltage-tolerance level.

By providing a low-voltage power supply backup means, a low-voltage power supply can be generated automatically from a high-voltage power line even when a low-voltage power supply is not on. In this manner the transistors can be confined to a low voltage-tolerance level during the non-availability of a low-voltage power supply.

Further, by providing a timing circuit, it is possible to prevent the condition in which both the low-level and high-level electric potential transmission transistors are on in the output buffer circuit. This eliminates the through current, thus reducing the power consumption.

Further, using only an output buffer circuit it is possible to obtain an output signal with a wide logical amplitude, based on the first input signal of a narrow logical amplitude and the second input signal of a narrow logical amplitude. Because the first voltage application relaxation means exists, the voltage application to the first conductivity-type MIS transistor for the transmission of low-level electric potential is relaxed when the first conductivity-type MIS transistor for the transmission of low-level electric potential is off and the second conductivity-type MIS transistor for the transmission of high-level electric potential is on. Conversely, the voltage application to the second conductivity-type MIS transistor for the transmission of high-level electric potential is relaxed when the first conductivity-type MIS transistor for the transmission of low-level electric potential is on and the second conductivity-type MIS transistor for the transmission of high-level electric potential is off. Therefore, the output buffer circuit can be constructed using transistors all of which are of low-voltage tolerance.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 11(a) is a graph showing the voltage-current characteristic of a P-type MOS transistor. FIG. 11(b) is a graph showing the voltage-current characteristic of a P-type MOS transistor when the transistor is off.

DESCRIPTION OF THE PREFERRED EMBODIMENTS

The following is an explanation of the embodiments of the signal voltage level conversion circuit of the present invention with reference to the attached drawings.

Embodiment 1

Figure 1:
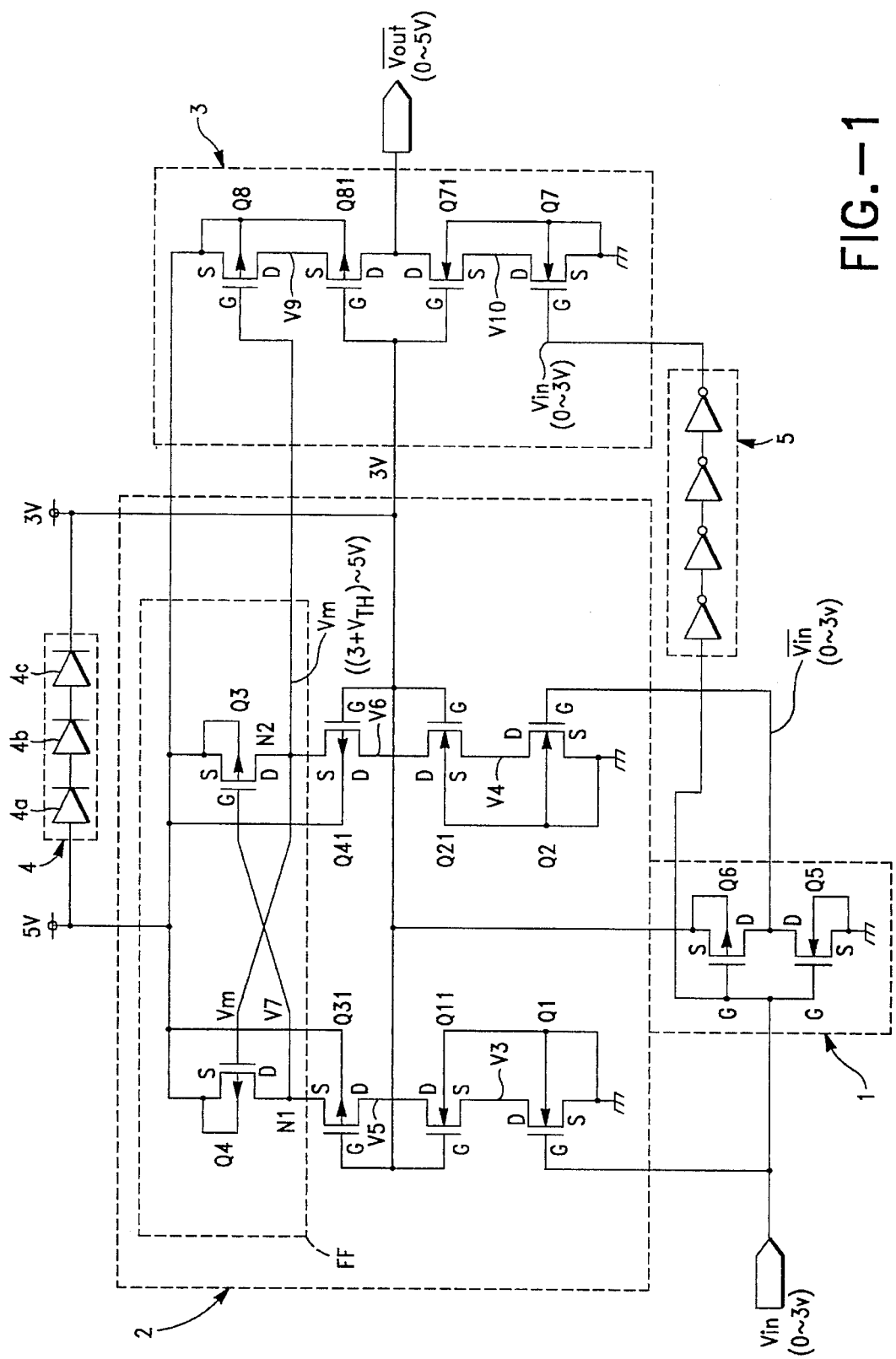
FIG. 1 is a circuit diagram of the signal voltage level conversion circuit for the first embodiment of the present invention.

FIG. 1 shows a circuit diagram for Embodiment 1 of the present invention.

The signal voltage level conversion circuit shown in FIG. 1 comprises the following components: a CMOS inverter (1) (inverse signal generation circuit) that generates the inverted signal Vin (bar) with a narrow logical amplitude of 0–3 v by means of an input signal Vin with a narrow logical amplitude of 0–3 v; a mediator signal generation circuit (2) that generates a mediator signal Vm that has a second logical amplitude (approximately 3–5 v) based on the input signal Vin with the narrow logical amplitude of 0–3 v and the inverted signal Vin (bar), and defined by a low level (the second low level, approximately 3 v) higher than the low level of the narrow logical amplitude (first low level, 0 v) and by a high level (the second high level, 5 v) with a wide logical amplitude of 0–5 v; an output buffer circuit (3) that is based on the 0–3 v input signal Vin and a mediator signal Vm with approximately 3–5 v, corresponding to the logic of the input signal Vin and that generates an output signal Vout (bar) with a wide logical amplitude of 0–5 v; a low-voltage backup circuit (4) that exists between the 5 v (high-voltage) power line and the 3 v (low-voltage) power line; and a timing circuit (5) that supplies the signal obtained by delaying the rise of the input signal Vin.

The CMOS inverter (1) comprises of a P-type MOS transistor $Q_6$ and an N-type MOS transistor Q5 including an interconnected gate G to which the input signal Vin is applied. The source S for the P-type MOS transistor $Q_6$ is connected to the 3 v power line and the source S for the N-type MOS transistor Q5 is connected to the ground line. The drains D for the two transistors $Q_6$ and Q5 are interconnected. An inverted signal Vin (bar) with a narrow logical amplitude of 0–3 v, corresponding to the input signal Vin, is output from the drains D of the transistors $Q_6$ and Q5.

The mediator signal generation circuit (2) includes a serially connected first MOS transistor Q1 (N-type transistor) which is switching-controlled by the input signal Vin and the second MOS transistor Q2 (N-type transistor) which is switching-controlled by the inverted signal Vin (bar) and which turns on and off mutually exclusively with the first MOS transistor Q1. It also includes a serially connected third MOS transistor Q3 (P-type transistor), whose "on" action is controlled by the "on" action of the first MOS transistor Q1. It further includes a fourth MOS transistor Q4 (P-type transistor) whose "on" action is controlled by the "on" action of the second MOS transistor Q2; a voltage application relaxation MOS transistor $Q_{11}$ (N-type transistor) which relaxes the application of excess voltage to the first MOS transistor Q1 when the first MOS transistor is in the off state; a voltage application relaxation MOS transistor $Q_{21}$ (N-type transistor) which relaxes the application of excess voltage to the second MOS transistor Q2 when the second MOS transistor is in the off state; a low-level shift MOS transistor $Q_{31}$ (P-type transistor), which generates a mediator signal V7 that has a second narrow logical amplitude (approximately 3~5 v) that is defined by the following: the second low level (approximately 3 v), which is higher than the low level (0 v) of the narrow logical amplitude of 0~3 v, which is generated by the on/off actions of the first MOS transistor Q1, and the high level (5 v) of the wide logical amplitude of 0~5 v, and that applies the mediator signal V7 to the gate G of the third MOS transistor Q3; and a low-level shift MOS transistor $Q_{41}$ (P-type transistor), which generates a mediator signal Vm (the inverse of the mediator signal V7) that has a second narrow logical amplitude (approximately 3~5 v) that is defined by the following: the second low level (approximately 3 v), which is higher than the first low level (0 v) of the narrow logical amplitude of 0~3 v, which is generated by the on/off actions of the second MOS transistor Q2, and the second high level (5 v) of the wide logical amplitude of 0~5 v, and that applies the mediator signal Vm to the gate G of the fourth MOS transistor Q4.

The third and fourth MOS transistors Q3 and Q4 in the above mediator signal generator circuit (2) constitute a flip-flop FF (bistable circuit) that has exclusive logical input points (nodes) N1 and $N_2$ created by means of a feedback loop. The flip-flop is boosted by the 5 v voltage (high-voltage power source). A second low level (approximately 3 v) can be added from an external source to the nodes N1 and N2, exclusively according to the logic of the input signal Vin. Specifically, because the gate electric potentials of the N-type MOS transistor $Q_{11}$ and the P-type MOS transistor $Q_{31}$ are both 3 v and have a common drain, the two transistors $Q_{11}$ and $Q_{31}$ exclusively perform electric potential transmission and electric potential relaxation according to the logic of the input signal Vin. When the first MOS transistor Q1 is turned on and the 0V electric potential is transmitted to the source S of the transistor $Q_{11}$, the transistor $Q_{11}$ is turned on and transmits the 0 V electric potential to the drain D of the transistor $Q_{31}$, making the transistor $Q_{31}$ a source follower. Therefore, an approximately 3 v electric potential (the second low level), higher than the 0 v electric potential, is added to the node N1. This causes the application of excess voltage by the flip-flop FF to the transistors Q3 and Q4 to be relaxed. Conversely, when the first MOS transistor Q1 is turned off and, as will be described later, the transistor Q4 is turned on, the transistor $Q_{31}$ is turned on and transmits the 5 v electric potential to the drain D of the transistor $Q_{11}$. This makes the transistor $Q_{11}$ a source follower. Therefore, an electric potential (approximately 3 v) lower than the 5 v electric potential is added to the drain D of the first MOS transistor Q1. This causes the relaxation of the application of excess voltage to the MOS transistor Q1 when this transistor is turned off. Further, because the gate electric potentials of the MOS transistor $Q_{21}$ and the MOS transistor $Q_{41}$ are both 3 v and have a common drain, the two transistors $Q_{21}$ and $Q_{41}$ exclusively perform electric potential transmission and electric potential relaxation according to the logic of the inverted input signal Vin (bar).

When the second MOS transistor Q2 is turned on and the 0 V electric potential is transmitted to the source S of the transistor $Q_{21}$, the transistor $Q_{21}$ is turned on and transmits the 0 V electric potential to the drain D of the transistor $Q_{41}$, making the transistor $Q_{41}$ a source follower. Therefore, an approximately 3 v electric potential (the second low level), higher than the 0 v electric potential, is added to the node N2.

Therefore, the application of excess voltage to the transistors Q3 and Q4 of the flip-flop FF is alleviated. Conversely, when the second MOS transistor Q2 is turned off and the MOS transistor Q3 is turned on, as will be described below, the transistor $Q_{41}$ is turned on and transmits the 5 v electric potential to the drain D of the transistor $Q_{21}$. Because this makes the transistor $Q_{21}$ a source follower, an electric potential lower than the 5 v electric potential is applied to the drain D of the second MOS transistor Q2. In this manner, the application of excess voltage to the MOS transistor Q2, when it is off, is alleviated. The output buffer circuit 3 contains the following: a first MOS transistor $Q_7$ (N-type transistor) for the transmission of the low level (0 v), whose on/off actions are controlled by the input signal Vin; a voltage application relaxation MOS transistor $Q_{71}$ (N-type transistor) that reduces the application of excess voltage to the low-level transmission MOS transistor $Q_7$ when this transistor is in the off state; a second MOS transistor $Q_8$ (P-type transistor) for the transmission of the high level (5 v), whose on/off actions are controlled by the mediator signal Vm; and a voltage application relaxation MOS transistor $Q_{81}$ (P-type transistor) that reduces the application of excess voltage to the high-level transmission MOS transistor $Q_8$ when this transistor is in the off state. The MOS transistors $Q_7$, $Q_{71}$, $Q_{81}$, and $Q_8$ form a serial circuit.

The low-voltage power supply backup circuit (4) is a voltage-fall circuit using the sum of cut-in voltages through the serial connection of three junction diodes, 4a, 4b, and 4c. The anode of the diode 4a is connected to the high-voltage power line 5 v, and the cathode of the diode 4c is connected to the low-voltage power line 3 v. The timing circuit (5) is a rise delay circuit made by serially connecting CMOS inverter circuits in four stages.

The following is an explanation of the operation of this embodiment. The first step is an explanation of the process by which the mediator signal Vm, approximately 3~5 v, is generated by the mediator signal generation circuit (2).

Figure 2:
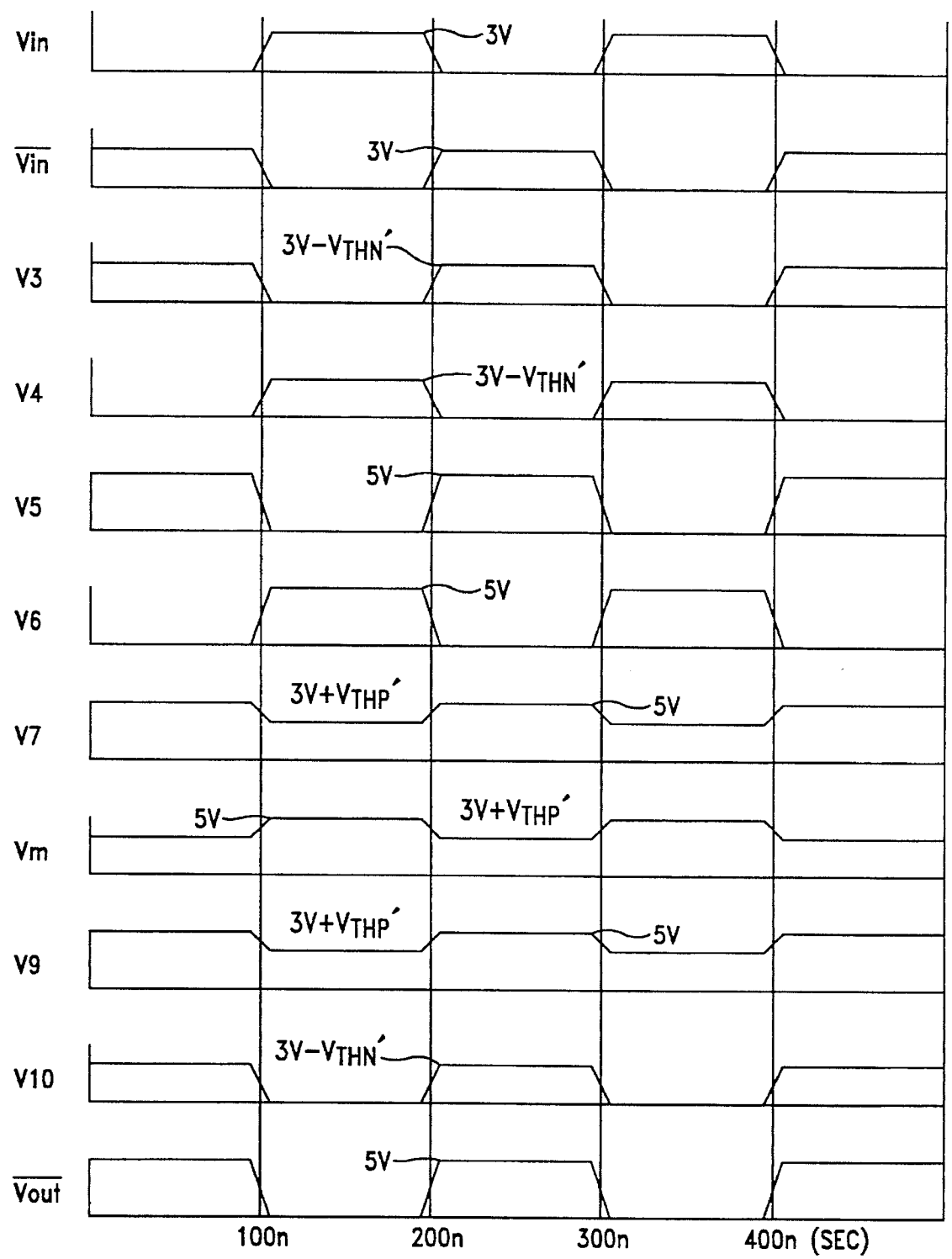
FIG. 2 is a timing chart showing the signal waveforms of the various components of the first embodiment of the present invention.

As shown in FIG. 2, when the input signal Vin with a narrow logical amplitude of 0~3 v reaches a high level of 3 v (the first high level), the transistor Q1 for the transmission of electric potential is turned on, and the 0 v electric potential is transmitted to its drain D side. Because when the transistor Q1 is on, the voltages between gate G and source S, between gate G and drain D, and between gate G and the substrate of the transistor Q1 itself are 3 v - 0 v, respectively, the transistor Q1 remains in the 3 v voltage tolerance range. When this transistor Q1 is turned on, the source electric potential, V3, of the transistor $Q_{11}$ (the drain electric potential of the transistor Q1) becomes 0 v, as shown in FIG. 2, thus causing the transistor $Q_{11}$ to be turned on. Because of the electric potential transmission function of the transistor $Q_{11}$, the electric potential V3 (0 v) is transmitted to the drain D of the transistor $Q_{11}$ as is. This causes the drain voltage V5 of the transistor $Q_{31}$ to become 0 v, as shown in FIG. 2. It should be noted that because the voltages between gate G and source S, between gate G and drain S, and between gate G and the substrate of the transistor $Q_{11}$ itself are 3 v - 0 v, respectively, the transistor $Q_{11}$ also remains in the 3 v voltage tolerance range. Because the substrate for the transistor $Q_{31}$ is connected to the 5 v power line (substrate bias effect) and the input of the 0 v electric potential is added to the drain D of the transistor $Q_{31}$, the output becomes the source S. Therefore, the transistor $Q_{31}$ comprises a source follower circuit. When an 0 v is applied to the drain voltage V5 when the gate electric potential of the transistor $Q_{31}$ is 3 v, the source voltage V7 equals the sum of the gate electric potential and the transistor threshold voltage VTHP', i.e., (3 v +VTHP') by virtue of the transistor $Q_{31}$ being a source follower (FIG. 2). The threshold value voltage VTHP' is equal to the threshold value voltage which is in effect when a back gate bias (5 v) is applied in a P-type MOS transistor and is expressed as an absolute value. It follows that the voltage between gate G and source S of the transistor $Q_{31}$ is 3 v+VTHP'–3 v= VTHP', the voltage between gate G and drain D is 3 v–0 v=3 v, and the voltage between gate G and the substrate is 5 v–3 v=2 v. This substrate can be connected to the source S. In this case, in which the voltage between the gate and substrate is VTHP'=VTHP, the source follower is retained even when the substrate bias effect disappears. In the absence of the substrate bias effect for an N-type MOS transistor, the voltage between the gate and substrate is VTHN'=VTHN. Therefore, the transistor $Q_{31}$ remains within the 3 v voltage tolerance range. Thus, when the input signal Vin reaches the first, 3 v, high level, the second low level (approximately 3 v), which is an intermediate electric potential (3 v+VTHP') increased by the electric potential buffering action of the source follower, is added to node N1 instead of the first, 0 v, low level.

On the other hand, when the input signal Vin is 3 v, its inverted signal Vin (bar) is 0 v, as shown in FIG. 2. Consequently, the electric potential transmission transistor Q2 is off. Because the transmission of electric potential from the transistor Q2 to the source S of the transistor $Q_{21}$ does not occur, and, as will be described below, the 5 v electric potential is applied to the drain D of the transistor $Q_{21}$ via the flip-flop FF, the transistor $Q_{21}$ forms a source follower circuit, thus causing the source voltage V4 of the transistor $Q_{21}$ to equal (3 v–VTHN'). The threshold value voltage VTHN' is equal to the threshold value voltage which is in effect when a back gate bias (0 v) is applied in an N-type MOS transistor and is expressed as an absolute value. It follows that the voltage between gate G and drain D of the transistor Q2 is 3 v–VTHN', and the voltage between gate G and the substrate is 0 v. Therefore, when turned off, the transistor Q2 remains within the 3 v voltage tolerance range.

When the input signal Vin is 3 v, the gate voltage V7 (the electric potential of node N1) is defined by the transistors Q1 and $Q_{31}$ as the second low level to the (3 v+VTHP') electric potential. Therefore, the transistor Q3, one of the flip-flop FF's transistors, is turned on, and its drain voltage, i.e., mediator voltage Vm, becomes 5 v (the second high level). Because, for the transistor Q3, the voltages between gate G and source S, between gate G and drain D, and between gate G and the substrate are 5 v–(3 v+VTHP')=2 v–VTHP', respectively, the transistor Q3 remains within the 3 v voltage tolerance range. In this case the transistor $Q_{41}$ performs the electric potential transmission function, causing its drain voltage V5 to equal 5 v. Because, for the transistor $Q_{41}$, the voltages between gate G and source S, between gate G and drain D, and between gate G and the substrate are 5 v–3 v=2 v, the transistor $Q_{41}$ remains within the 3 v voltage tolerance range. Further, the transmission of 5 v voltage as an input into the drain D of the transistor $Q_{21}$ makes the transistor $Q_{21}$ a source follower, in which case the source electric potential V4 is equal to (3 v–VTHN'). Because, for the transistor $Q_{21}$, the voltage between gate G and source S is 5 v–3 v=2 v and the voltage between gate G and source S is 3 v–(3 v–VTHN')=VTHN', and the voltage between gate G and the substrate is 3 v, the transistor $Q_{21}$ remains within the 3 v voltage tolerance range. Further, when the drain voltage Vm of the transistor Q3 becomes 5 v, the transistor Q4 is turned off. Therefore, for the transistor Q4 the voltages between gate G and source S, and between gate G and the substrate are 0 v, and because the voltage between gate G and drain D is 5 v–(3 v+VTHP')=2 v–VTHP', the transistor Q4 also remains within the 3 v voltage tolerance range.

Thus, when the input signal Vin is at 3 v (the first high level), the mediator signal Vm is at 5 v (the second high level). Under these conditions all the transistors $Q_1$, $Q_2$, $Q_3$, $Q_4$, $Q_{11}$, $Q_{21}$, $Q_{31}$, and $Q_{41}$ that comprise the mediator signal generation circuit (2) are within the 3 v voltage tolerance range. The transistor $Q_{21}$ has the voltage application relaxation function which reduces the voltage applied to the drain D of the transistor Q2 when the transistors Q3 and $Q_{41}$ are turned on. If the transistor $Q_{21}$ does not exist, a 5 v voltage is directly applied to the drain D of the transistor Q2, which can cause the voltage breakdown of the gate insulator of the transistor Q2. However, in this embodiment, when the transistor Q2 is off, the buffering effect of the transistor $Q_{21}$, which acts as a source follower, performs a 5 v–(3 v–VTHN')=2 v+VTHN' voltage relaxation function with respect to the drain D of the transistor Q2, thus eliminating the voltage breakdown potential. On the other hand, the transistor $Q_{31}$ generates the mediator signal V7 of a narrow logical amplitude (approximately 3–5 v) by adding the second low level (approximately 3 v), higher than the first low level (0 v) of a narrow logical amplitude with 0–3 v, to the node N1 of the flip-flop FF, thus simultaneously eliminating the possibility of a voltage breakdown of the transistors Q3 and Q4. The reason is that if the transistor $Q_{31}$ does not exist, an 0 v voltage is directly applied to the drain D of the transistor Q4 and to the gate G of the transistor Q3 when the transistors Q1 and $Q_{11}$ are turned on. This causes the addition of 5 v to the area between the gate and drain of the transistor Q4, and 5 v to the area between the gate and source of the transistor Q3, thus creating the possibility of voltage breakdown for the transistors Q4 and Q3, whose voltage tolerance is 3 v. However, in this embodiment the buffering effect of the voltage relaxation transistor $Q_{31}$ causes an increase in the drain voltage for transistor Q4 and the gate voltage of transistor Q3 from 0 v to 3 v+VTHP'. The resulting 3 v+VTHP' voltage relaxation effect prevents the voltage breakdown of the transistors Q3 and Q4.

When the input signal Vin is at 0 v, its inverted signal Vin (bar) becomes 3 v. However, because of the symmetry of the mediator signal generation circuit (2), the operations of the transistors Q1, $Q_{11}$, $Q_{31}$, and Q4 are the same as those of the transistors Q2, $Q_{21}$, $Q_{41}$, and Q3 when the input signal Vin is at 3 v. Similarly, the operations of the transistors Q2, $Q_{21}$, $Q_{41}$, and Q3 are the same as those of the transistors Q1, $Q_{11}$, $Q_{31}$, and Q4 when the input signal Vin is at 3 v. Therefore, mediator signal Vm equals 3 v+VTHP'. In this case the transistor $Q_{11}$ is a source follower and performs a voltage relaxation of 5 v–(3 v–VTHN') with respect to the drain of the transistor Q1, thus preventing the voltage breakdown of the transistor Q1. Similarly, the transistor $Q_{41}$ also becomes a source follower and increases the drain voltage of transistor Q3 and the gate voltage of transistor Q4 from 0 v to 3 v+VTHP', thus relaxing the voltage applied to the transistors Q3 and Q4 and preventing their voltage breakdown.

The following is an explanation of the operation of the output buffer circuit (3). As described above, the mediator signal generation circuit (2) converts the input signal Vin with a narrow logical amplitude 0–3 v to the mediator signal Vm with a second narrow logical amplitude (3 v+VTHP'–5 v). By using the mediator signal Vm, it is possible to obtain the output signal Vout (bar) with a wide logical amplitude (0–5 v) with a sufficient current capacity from the output buffer circuit (3). First, when the mediator signal Vm is at a high level of 5 v (when the input signal Vin is at 3 v), the transistor $Q_7$ is turned on and the transistor $Q_8$ is turned off. Because the gate electric potentials of MOS transistors $Q_{71}$ and $Q_{81}$ are both at 3 v, when the transistor $Q_7$ is turned on, the transistor $Q_{71}$, performing the electric potential transmission function in this case, transmits an 0 v electric potential to the drain D of transistor $Q_{81}$, thus causing the output signal Vout (bar) to equal the first low-level electric potential 0 v. Because the drain D of transistor $Q_{81}$ has a 0 v electric potential, the transistor $Q_{81}$ becomes a source follower. If transistor $Q_{81}$ does not exist, a 0 v electric potential is directly applied to the drain D of transistor $Q_8$. This causes the voltage between gate G and drain D of transistor $Q_8$ to equal 5 v with the possibility of a voltage breakdown in the 3 v voltage-tolerant transistor, $Q_8$. However, when the transistor $Q_7$ is on, the buffering presence of the source follower transistor $Q_{81}$ makes the drain electric potential V9 of transistor $Q_8$ equal to (3 v+VTHP'), thus making the voltage between gate G and drain D of transistor $Q_8$ equal to 5 v–(3 v+VTHP')=2 v–VTHP'.

As a result, each of the voltages between gate G and source S, gate G and drain D, and gate G and the substrate of the transistor $Q_8$ is less than 3 v, thus keeping the transistor $Q_8$ within the 3 v voltage tolerance range. Similarly, the transistors $Q_{81}$, $Q_{71}$, and $Q_7$ are also maintained within the voltage tolerance range. Optionally, the substrate for transistor $Q_{81}$ can be connected to the source of the same transistor.

On the other hand, when the mediator signal Vm is at a low level (when the input signal Vin is at 0 v), the transistor $Q_8$ is turned on and the output signal Vout (bar) reaches the second high-level electric potential of 5 v. If transistor $Q_{71}$ does not exist, a 5 v electric potential is directly applied to the drain D of transistor $Q_7$. This causes the application of 5 v to the drain D of transistor $Q_7$, thus causing the voltage between gate G and drain D of transistor $Q_7$ to equal 5 v, with the possibility of causing a voltage breakdown in the 3 v voltage-tolerant transistor, $Q_7$. However, when the transistor $Q_8$ is on, the buffering presence of the source follower transistor $Q_{71}$ makes the source electric potential V10 of transistor $Q_{71}$ equal to (3 v–VTHN'), thus making the voltage between gate G and drain D of transistor $Q_7$ equal to (3 v –VTHN'). As a result, each of the voltages between gate G and source S, gate G and drain D, and gate G and the substrate of the transistor $Q_7$ is less than 3 v, thus keeping the transistor $Q_7$ within the 3 v voltage tolerance range. Similarly, the transistors $Q_{71}$, $Q_8$, and $Q_{81}$ are also maintained within the voltage tolerance range. Optionally, the substrate for transistor $Q_{81}$ can be connected to the source for the same transistor. Thus, the presence of the transistors $Q_{71}$ and $Q_{81}$ that perform the voltage application relaxation function on an exclusive basis makes it possible to maintain all transistors in the output buffer circuit (3) in the 3 v voltage tolerance range. Although in this embodiment the transistors $Q_{11}$, $Q_{21}$, $Q_{31}$, $Q_{41}$, $Q_{71}$, and $Q_{81}$ are described as being directly connected to a 3 v power line, it is not necessary that this voltage be 3 v. As long as it is within the voltage tolerance range of these transistor, the power line voltage can be any value in the neighborhood of 2.5 v.

The signal voltage level conversion circuit (2) and the output buffer circuit (3) of this embodiment require 5 v and 3 v power sources. During circuit startup, if only the 5 v power source is applied and the 3 v power source is not for some reason, and if a low-voltage power backup circuit (4) does not exist, the voltage breakdown of transistors $Q_{11}$, $Q_{21}$, $Q_{71}$, $Q_{31}$, $Q_{41}$, and $Q_{51}$ can result. If, for example, the transistor Q4 is on and the transistor Q3 is off, the gate voltage of the transistors $Q_{31}$ and $Q_{11}$ is 0 v. This causes the transistor $Q_{31}$ to be in the on state and the transistor $Q_{11}$ to be in the off state. Thus, a 5 v voltage is applied to the drain of transistor $Q_{11}$, with the possibility of causing a voltage breakdown of transistor $Q_{11}$. Therefore, a low-voltage power backup circuit (4) is provided in order to generate automatically a 3 v low-voltage power from the 5 v power source and add the 3 v power to the 3 v power line. In this manner, even if a 3 v power is not supplied externally, the transistor $Q_{11}$ is turned on, thus preventing its voltage breakdown. In this embodiment the voltage reduction circuit (4) is composed of three junction diodes, 4a, 4b, and 4c. Consequently, by setting the cut-in voltage of the junction diodes (silicon diodes) at 0.8 v, a 2.4 v voltage reduction can be produced using three diodes. Thus, even if a 3 v power is not supplied, a 2.6 v voltage is applied to the 3 v power line. If a 3 v power is applied subsequently, a leak current flows to the 3 v power line from the 5 v power line through the diodes 4a, 4b, and 4c, thus preventing any problem during normal usage. Further, even when the 3 v power line is a floating line, either transistor Q3 or Q4 is turned on due to the charge remaining in the transistors or due to the asymmetry of transistors, thus ensuring that all transistors are within the 3 v voltage tolerance range. On the other hand, if only a 3 v power is applied, there is no possibility of a voltage breakdown because all transistors can withstand the 3 v (3.3 v) voltage. Similar to the voltage reduction based on the use of cut-in voltages from diodes, the threshold voltages of MOS transistors can also be used.

If the input signal Vin is directly applied to the output buffer circuit (3), the input signal will not synchronize with the phases of the mediator signal Vm, which is generated through numerous circuit elements in the mediator signal generation circuit (2). Therefore, in this embodiment, a timing circuit (5) is provided in order to delay the rise of the input signal Vin for a prescribed length of time. When the mediator signal Vm and the input signal Vin, output from the timing circuit (5), are synchronized, the MOS transistors $Q_7$ and $Q_8$ accurately perform mutually exclusive on/off operations, thus eliminating the possibility of a simultaneous on condition. This eliminates any through current that might flow to the ground from the 5 v power source through the serial transistor circuit of the output buffer circuit (3). Although the rise and fall of the input signal Vin are not delayed by the timing circuit (5) of this embodiment, periods in which both MOS transistors $Q_7$ and $Q_8$ are turned off can be allowed. Obviously, both the rise and fall can be delayed.

In the above embodiment the output signals with wide logical amplitudes of 0–5 v are obtained from the output buffer circuit (3) in order to ensure a sufficient current capacity by increasing the channel widths of MOS transistors $Q_7$ and $Q_8$. However, if the problem of current capacity can be ignored, the logic signals with wide logical amplitudes of 0–5 v are already obtained through the use of electric potentials V5 and V6 of the mediator signal generation circuit (2). Therefore, the mediator signal generation circuit (2) also functions somewhat as a signal voltage level conversion circuit.

From the symmetry of the polarity and conductor type, it is obvious that the same operating effects can be obtained by changing the 5 v power supply to a −5 v power supply and the 3 v power supply to a −3 v power supply and by changing the conductor type of the above-mentioned MOS transistors to the reverse conductor type.

Second Embodiment

Figure 3:
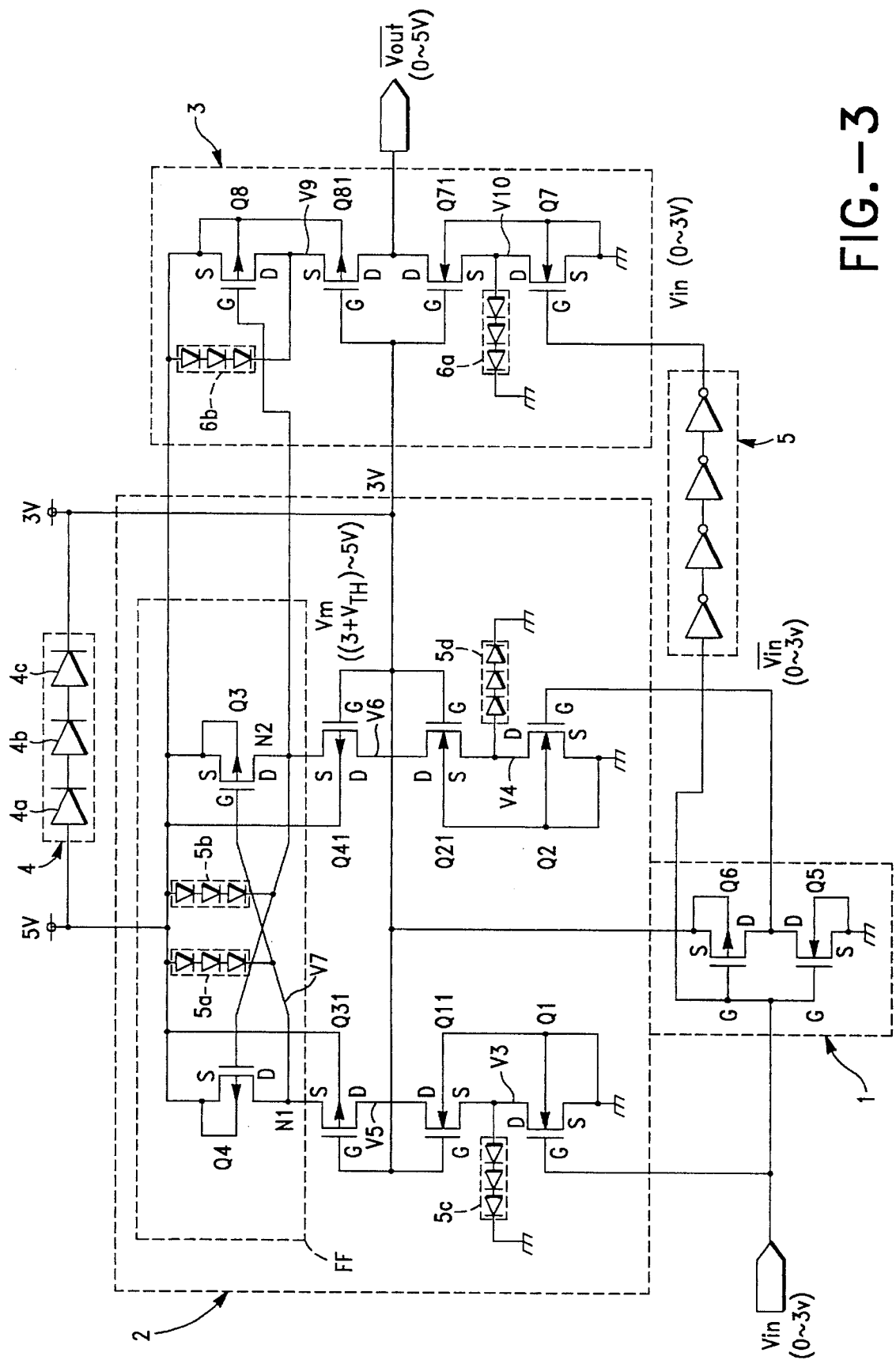
FIG. 3 is a circuit diagram of the signal voltage level conversion circuit for the second embodiment of the present invention.

FIG. 3 shows a circuit diagram for the second embodiment of the present invention.

In this second embodiment the same reference numbers are assigned to the components as are used in the first embodiment. An explanation of these identical components is omitted. Compared with the circuit configuration of the first embodiment, this embodiment contains additional items of level-holding circuits 5a, 5b, and 6b as lower-bound limiters, and level-holding circuits 6a, 5c, and 5d as upper-bound limiters that inhibit the rise in electric potential. If the level-holding circuit 5a does not exist between node N1 and the 5 v power line, when the transistor Q4 is turned off, the gate voltage V7 of transistor Q3 is (3 v+VTHP'). In this case the slight leak current from the source follower transistor $Q_{31}$ causes the gate voltage (mediator signal voltage) V7 to fall gradually, thus ultimately causing the voltage between gate and drain of the transistors Q4 and Q3 to exceed 3 v. This creates the possibility of a voltage breakdown of the transistor Q4. In this embodiment a level-holding circuit 5a, composed of a serial circuit of three junction diodes, is provided and its forward direction voltage (cut-in voltage= 0.8×3=2.4 v) keeps any decline in the low level of the gate voltage V7 within a prescribed value (approximately 3.6 v) and maintains the low level at this value. This can prevent a voltage breakdown of the transistors Q4 and Q3. The level-holding circuit 5a inhibits any decline in the electric potential that was added to node N1 as a lower-bound limiter. For the same reason, the level-holding circuit 5b inhibits any temporary decline in the low level of the mediator signal voltage Vm, thus preventing a voltage breakdown of transistors such as Q3 and Q4. Although level-holding circuits 5a and 5b are located between the gate for transistors Q3 and Q4 and the 5 v power line, instead of this configuration one junction diode can be provided between the gate for transistors Q3 and Q4 and the 3 v power line. The level-holding voltage of this diode is approximately 2.2 v, and is capable of maintaining the transistors Q3 and Q4 within the 3 v voltage tolerance range. The use of a single junction diode minimizes the number of wells used in the semiconductor device.

On the other hand, the level-holding circuit 5c, functioning as an upper-bound limiter, inhibits the rise in the electric potential V3 when the transistor Q1 is turned off. Because the transistor $Q_{11}$ becomes a source follower when the transistor Q1 is turned off, initially the electric potential V3 is (3 v−VTHN'). Although this electric potential increases gradually due to a minute leak current, the rise in the electric potential is inhibited by the level-holding circuit 5c composed of the serial connection of three junction diodes (cut-in voltage=0.8×3=2.4 v), thus maintaining the transistor Q1 within the 3 v voltage tolerance range. Similarly, the level-holding circuit 5d inhibits the rise in the electric potential V4, thus preventing a voltage breakdown of the transistor Q2. Instead of providing a serial connection of three junction diodes between drain D and the ground line of transistors Q1 and Q2, one junction diode can be connected between drain D and the 3 v power line of transistors Q1 and Q2. In this case any rise in the electric potentials V3 and V4 is held at approximately 3.8 v. Although in the strict sense the transistors Q1 and Q2 are not maintained in the 3 v voltage range, under the normal safety rate (approximately 4 v), this level of voltage tolerance should be sufficient. The low-voltage power supply used is 3 v in order to match the high level of a narrow logical amplitude. However, as noted above, since a power source voltage approximately 2.5 v is also acceptable, in this case the above limit voltage will be approximately 3.2 v. The use of one diode saves space in the semiconductor device area and prevents any waste of current on the ground side. Because the current can be reused on the low-voltage power source side, the power consumption can be reduced commensurably.

In the output buffer circuit (3), too, if a level-holding circuit 6a, serving as a lower-bound limiter, does not exist, the source voltage V10 of the transistor $Q_{71}$ is equal to (3 v−VTHN'). However, the source voltage V10 increases gradually due to a minute leak current from the transistor $Q_{71}$, causing the gate-source voltage to fall below the threshold voltage VTHN'. This turns off the transistor $Q_{71}$. The results are an increase in the drain electric potential of the transistor $Q_{71}$ and a potential voltage breakdown of the transistor $Q_7$. However, because the level-holding circuit 6a, composed of the serial connection of three junction diodes, is provided in this embodiment, the rise in source voltage V10 is kept within a prescribed value (approximately 2.4 v) by the forward-direction voltage (cut-in voltage) of the level-holding circuit, and the source voltage is maintained within this value. This prevents the transistor $Q_{71}$ from being turned on and any voltage breakdown of the transistor $Q_7$. Further, the level-holding circuit 6b, functioning as an upper-bound limiter, prevents the fall in voltage V9, and thus prevents a voltage breakdown of transistor $Q_8$. Instead of providing a serial connection of three junction diodes between drain D and the ground line of transistor $Q_7$, the level-holding circuit 6a can be constructed by connecting one junction diode between drain D and the 3 v power supply of transistor $Q_7$. This saves both space in the semiconductor device area and power consumption. Similarly, the level-holding circuit 6b can be constructed by connecting one junction diode between drain D and the 3 v power supply of transistor $Q_8$ in order to obtain the above advantages.

For the construction of level-holding circuits 5a, 5b, 6b, 6a, 5c, and 5d, serial circuits of MOS transistors and their threshold voltages can be used instead of diodes. In this manner upper or lower-bound voltage limiter means can be constructed.

Third Embodiment

Figure 4:
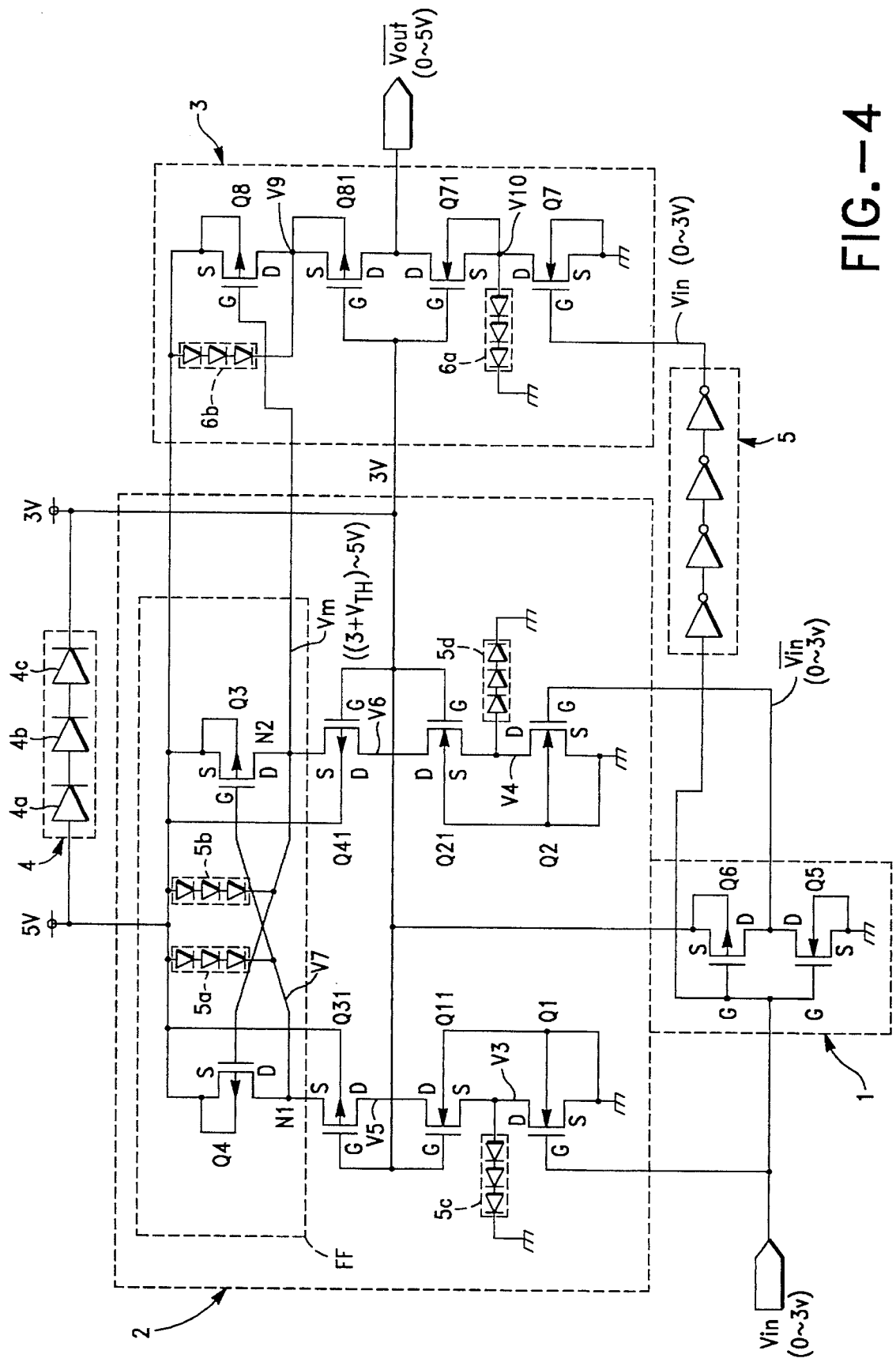
FIG. 4 is a circuit diagram of the signal voltage level conversion circuit for the third embodiment of the present invention.

FIG. 4 shows a circuit diagram for the third embodiment of the present invention.

In this third embodiment the same reference numbers are assigned to the components as are used in the second embodiment. An explanation of these components is omitted. Compared with the circuit configuration of the second embodiment, this embodiment eliminates the substrate bias effects of the source follower MOS transistors $Q_{11}$, $Q_{31}$, $Q_{21}$, $Q_{41}$, $Q_{71}$, and $Q_{81}$. Because the substrates of the transistors $Q_{11}$, $Q_{31}$, $Q_{21}$, $Q_{41}$, $Q_{71}$, and $Q_{81}$ are connected to source S, when the source follower state occurs, electric potentials V3, V4, and V10 become (3 v−VTHN), and electric potentials V7, Vm, and V9 become (3 v+VTHP), where VTHN represents the threshold voltage in an N-type MOS transistor in the absence of a backgate bias and is expressed as an absolute value. Similarly, VTHP represents the threshold voltage in a P-type MOS transistor in the absence of a backgate bias, and is expressed as an absolute value. Thus, the buffering electric potential value can be varied and adjusted by changing the value of the backgate voltage.

In this case, the voltage between gate G and source S of the transistor $Q_{31}$ is 3 v +VTHP=3 v=VTHP, the voltage between gate G and drain D is 3 v–0 v=3 v, and the voltage between gate G and the substrate is 5 v–3 v=2 v. Furthermore, the substrate can be connected to the source while maintaining the source follower condition. Moreover, the voltage between gate and substrate is VTHP. Consequently, the transistor Q3 remains within the 3 v voltage tolerance range. Thus, when the input signal Vin reaches the first high level, 3 v, the second low level (approximately 3 v), which is an intermediate electric potential (3 v+VTHP), is added to node N1 instead of the first low level, 0 v. Thus, if a substrate bias effect does not exist, the driving capacities of transistors Q3, Q4, and $Q_8$ can be increased.

Fourth Embodiment

Figure 5:
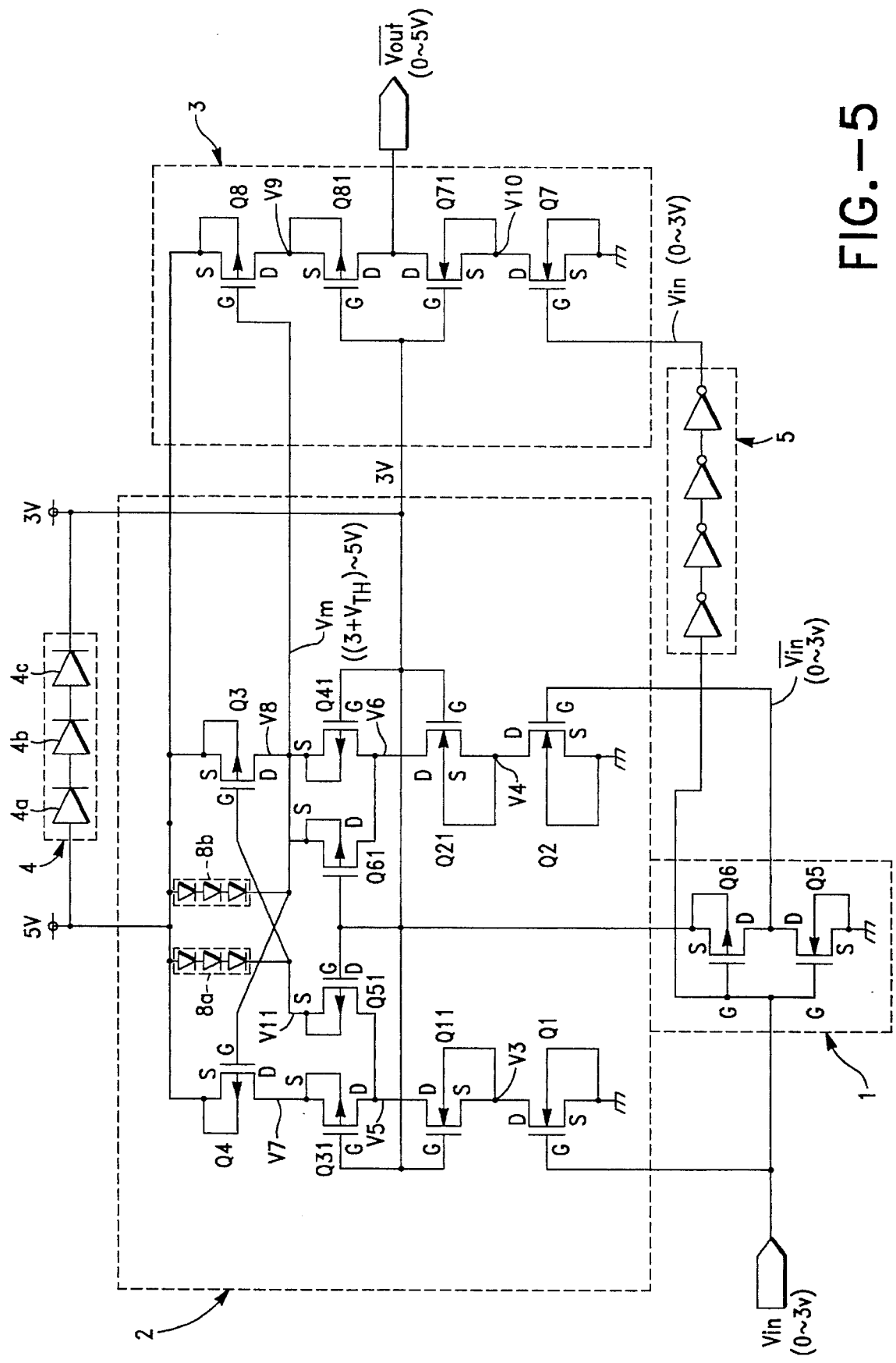
FIG. 5 is a circuit diagram of the signal voltage level conversion circuit for the fourth embodiment of the present invention.

FIG. 5 shows a circuit diagram for the fourth embodiment of the present invention.

This embodiment takes the mediator signal generation circuit (2) of the first embodiment and adds P-type MOS transistors $Q_{51}$ and $Q_{61}$, which are parallel to transistors $Q_{31}$ and $Q_{41}$, as well as diode circuits 8a and 8b composed of junction diodes that are serial to the P-type MOS transistors. The result is a non-flip-flop configuration. When the transistor Q1 is in the on state, the mutually parallel transistors $Q_{31}$ and $Q_{51}$ become source followers. However, the transistor $Q_{31}$ performs the function of protecting the transistor Q4 from voltage breakdown by providing a relaxed electric potential V7 to the drain D of the transistor Q4, while the transistor $Q_{51}$ provides drive control to the transistor Q3 by providing an electric potential V11, different from the electric potential V7, to the gate G of the transistor Q3. In this embodiment the diode circuit 8a regulates the lower limit of the gate voltage V11 using a forward-direction, sub-threshold-state leak current that flows in the diode circuit 8a. Similarly, when the transistor Q2 is in the on state, the mutually parallel transistors $Q_{41}$ and $Q_{61}$ become source followers. However, the transistor $Q_{41}$ performs the function of protecting the transistor Q3 from voltage breakdown by providing a relaxed electric potential V8 to the drain D of the transistor Q3, while the transistor $Q_{61}$ provides drive control to the transistor Q4 by providing an electric potential Vm, different from the electric potential V7, to the gate G of the transistor Q3 so as to turn on the transistor Q4. The diode circuit 8b regulates the lower limit of the gate voltage V11 using the sub-threshold-state leak current that flows in the diode circuit 8b.

Figure 6:
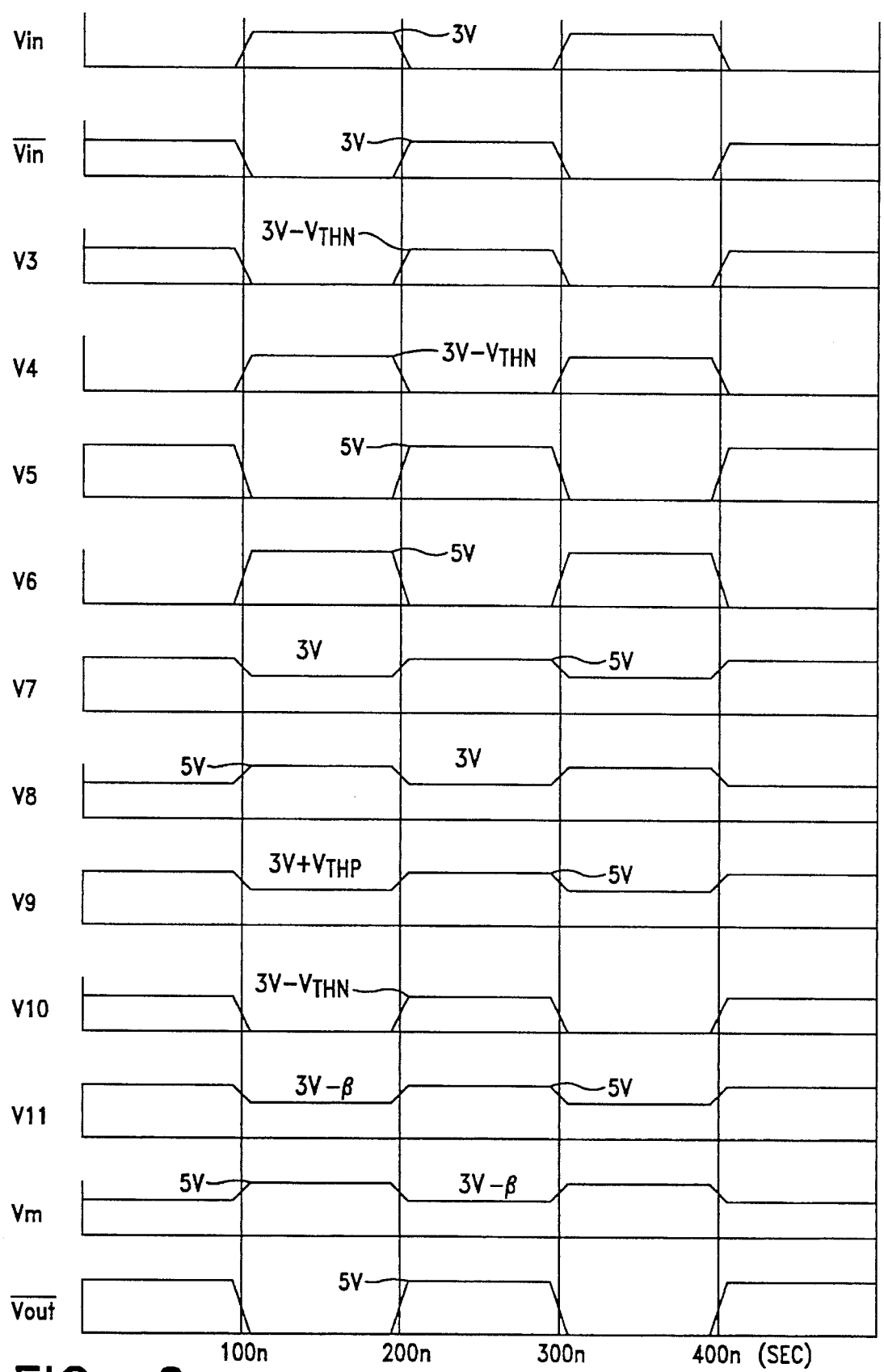
FIG. 6 is a timing chart showing the signal waveforms of the various components of the fourth embodiment of the present invention.

The following is an explanation of the action of the mediator signal generation circuit (2) in the fourth embodiment of the present invention. As shown in FIG. 6, when the input signal Vin, 0–3 v, is at a high level of 3 v, the N-type MOS transistor Q1 is turned on. This causes the electric potential transmission function of the transistor $Q_{11}$ to set the drain voltages of both transistors $Q_{31}$ and $Q_{51}$ to 0 v, thus making both transistors $Q_{31}$ and $Q_{51}$ source followers. Consequently, the source voltage V7 of transistor $Q_{31}$ and the source electric potential V11 of transistor $Q_{51}$ equal the sum of the gate voltage and the threshold voltage VTHP, namely, (3 v +VTHP). As a result, the transistors $Q_{31}$ and $Q_{51}$ are turned off. Because the source electric potential V11 is equal to (3 v+VTHP), the transistor Q3 is turned on, and its drain voltage V8 equals 5 v. Consequently, the transistor Q4 is turned off. In this case VTHP denotes the threshold voltage that is in effect when the substrate bias effect of a P-type transistor is not present, and the value is expressed as an absolute value.

However, because a leak current exists in an actual MOS transistor, the source voltage V7 of transistor $Q_{31}$ and the source electric potential V11 of transistor $Q_{51}$ do not necessarily equal the sum of the gate voltage and the threshold voltage VTHP, namely, (3 v+VTHP). Thus, the leak current causes the value of the source voltage to be approximately 3 v.

Figure 12A:
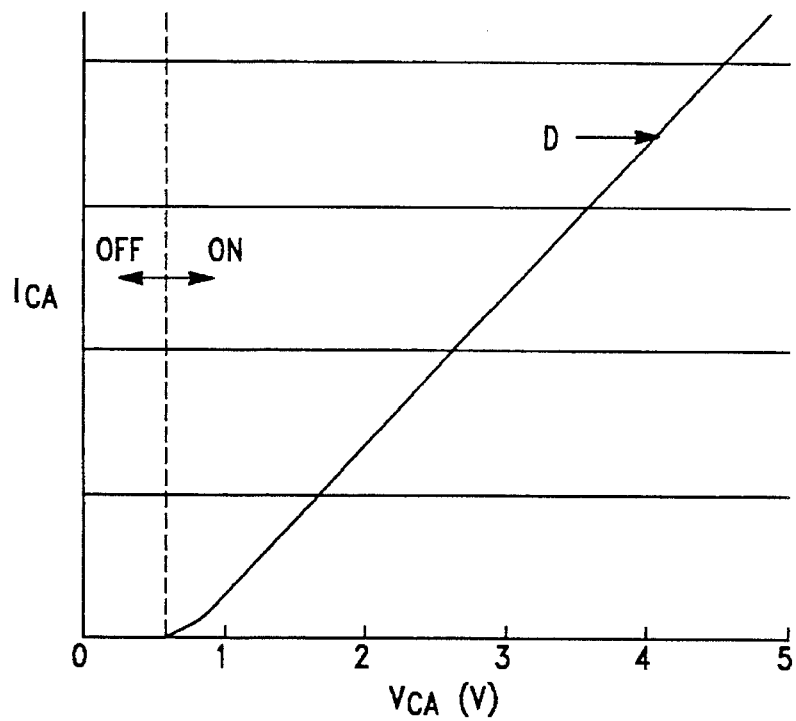
FIG. 12(a) is a graph showing the voltage-current characteristic of a junction diode.
Figure 12B:
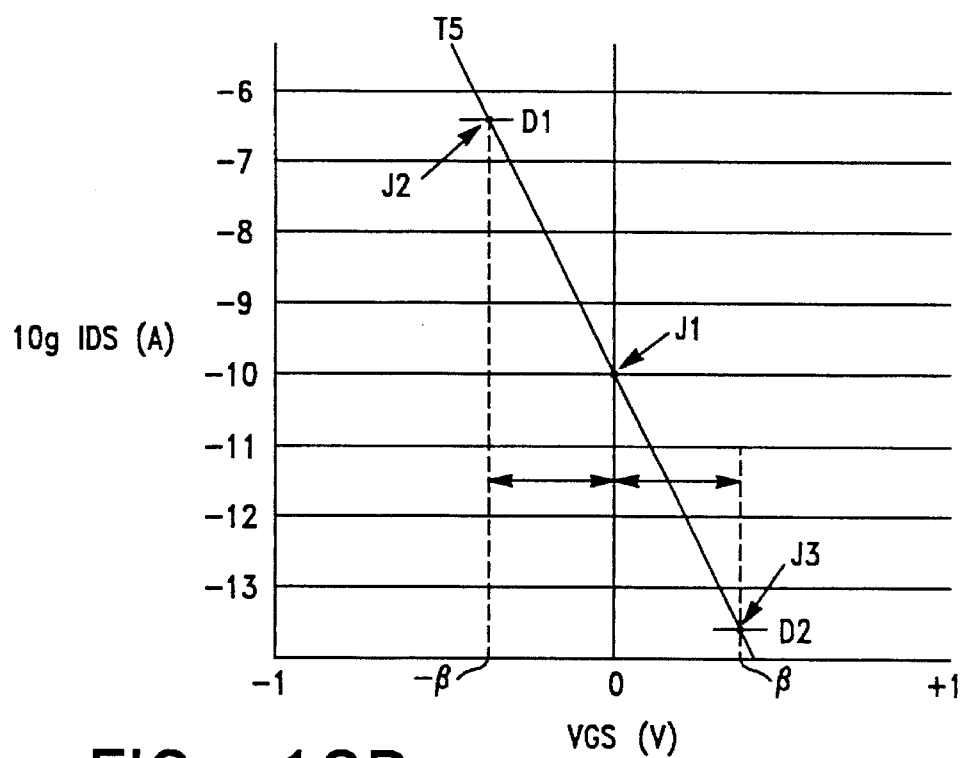
FIG. 12(b) is a graph showing the relationship between the voltage-current characteristic of a P-type MOS transistor when the transistor is off and the sub-threshold current of a diode circuit.
Figure 13A:
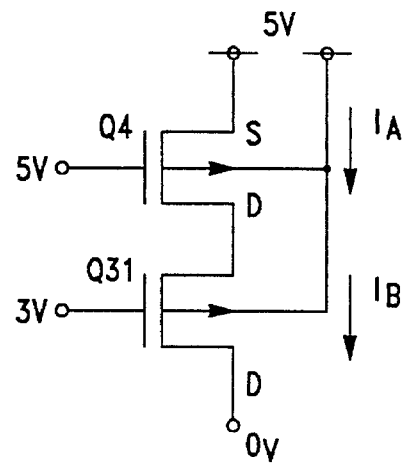
FIGS. 13(a), 13(b), and 13(c) are circuit diagrams showing the transistor relationship between transistor Q4 and transistor $Q_{31}$ in the first through seventh embodiments of the present invention.
Figure 13B:
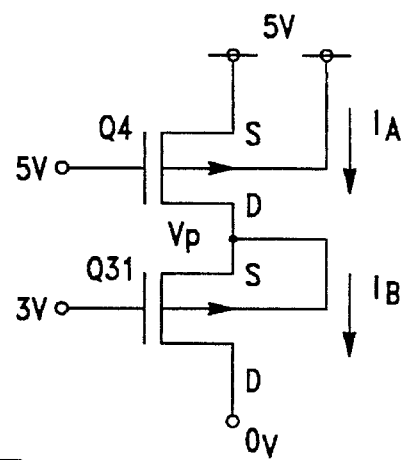
Figure 13C:
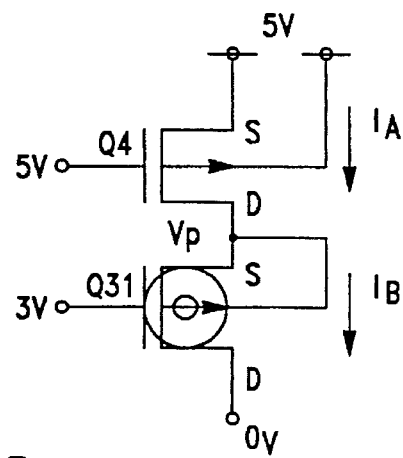
Figure 14:
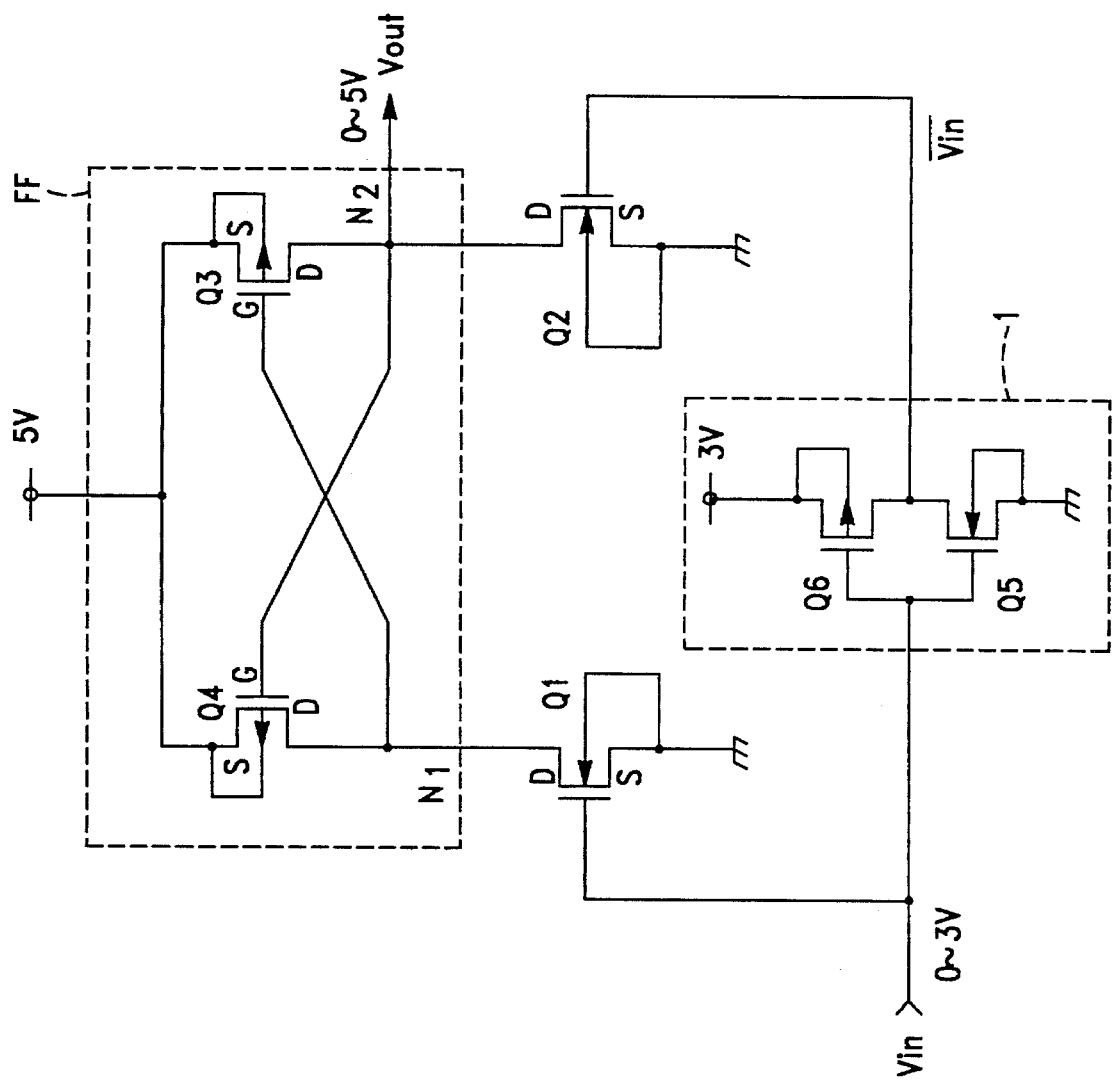
FIG. 14 is a circuit diagram of a conventional signal voltage level conversion circuit.

The following is an explanation of this relationship with reference to FIGS. 11, 12 and 13. As shown in FIG. 13 (b), when two P-type MOS transistors, such as P-type MOS transistor Q4 and P-type MOS transistor $Q_{31}$, are serially connected and are mutually in the "off" state (with $Q_{31}$ in the source follower state), the source voltage V7 (VP) of the P-type MOS transistor $Q_{31}$ is determined in terms of the off-current IA of the P-type MOS transistor Q4, which is in the off state, and by the leak current IB of the P-type MOS transistor $Q_{31}$, which is in the source follower state. FIG. 11 (a) shows the voltage-current characteristics of P-type MOS transistors. The graph can be divided into an ON region, in which the P-type MOS transistors are turned on when a gate-source voltage VGS greater than the threshold voltage Vth is applied to the area between gate and source; and an OFF region, in which the gate-source voltage VGS is less than the threshold voltage Vth and the transistors are in the off state. FIG. 11 (b) shows a semi-log plot of the OFF region in which the P-type MOS transistors are off. The X-axis represents the gate-drain voltages VGS of P-type MOS transistors, and the Y-axis (a log display) shows the drain-source currents IDS of P-type MOS transistors. Assume that "T3" in FIG. 11 (b) represents the voltage-current characteristic of the off-state P-type MOS transistor ($Q_4$). Generally, the voltage-current characteristic in the off region varies with the channel length, channel width, and threshold voltage of the MOS transistor.

(1) The off current of P-type MOS transistor Q4 and the leak current of P-type MOS transistor $Q_{31}$ are the same.

This condition holds when the MOS transistors are equal, i.e., they have the same transistor size (channel length and width), the same threshold voltage Vth, and the same polysilicon gate size.

If the source-drain voltages are approximately equal, the voltage-current characteristic of P-type MOS transistor $Q_{31}$ also becomes equal to T3. As shown in FIG. 13 (b), 5 v is applied to the transistor Q4's gate, so that the gate-source voltage VGS=0 v, and the off current IA at point E1 of VGS=0 v flows between the drain and the source. Since transistor $Q_{31}$ also has the same transistor characteristic, its off current (leak current) IB=IA. However, since the source-drain voltage of P-type MOS transistor Q4 is approximately 2 v and the source-drain voltage of P-type MOS transistor $Q_{31}$ is approximately 3 v, it is assumed that these voltages are virtually equal. Therefore, since the gate-source voltage of transistor $Q_{31}$ is 0 v, as indicated in FIG. 13 (b) the source voltage (VP) of P-type MOS transistor $Q_{31}$ is 3 v. In other words, as shown in FIG. 13 (b), if transistors Q4 and $Q_{31}$ have the same transistor conditions in which a substrate bias is not applied, not only the source voltage V7 (VP) in the source follower is (3 v+VTHP), but also the source voltage V7 (VP) is 3 v because of the leak current.

(2) The leak current of P-type MOS transistor $Q_{31}$ is less than the off current of P-type MOS transistor Q4.

In the circuit in which a substrate bias effect is provided, as described in the first and second embodiments, i.e., as shown in FIG. 13 (a), and if the substrate for P-type MOS transistor $Q_{31}$ is connected to a 5 v power line, even when transistors Q4 and $Q_{31}$ have the same transistor conditions, the substrate bias effect of transistor $Q_{31}$ causes its voltage-current characteristic to be equal to T2 in FIG. 11 (b), in which case the off current IB at point C1 of VGS=0 v is less than the off current IA at point E1 of the P-type MOS transistor Q4. However, since the current flowing in the serial circuit is equal to the value of off current IA, transistor $Q_{31}$ is at point C2 of T2. Therefore, since the gate-source voltage VGS of transistor $Q_{31}$ is −a, the source voltage V7 (VP) is 3 v−(−a)=3 v+a. Thus, even when transistors Q4 and $Q_{31}$ have the same transistor conditions, by applying a substrate bias effect to transistor $Q_{31}$ the source voltage V7 (VP) can be adjusted to a value greater than 3 v, thus reducing the voltage tolerance of transistor Q4. Beyond using a substrate bias effect, the following measures can be taken in order to adjust the source voltage V7 (VP) to a value greater than 3 v:

(1) Reducing the threshold voltage of transistor Q4 to a value less than that of transistor $Q_{31}$.

(2) Making the polysilicon gate size of transistor Q4 smaller than that of transistor $Q_{31}$.

(3) Applying a voltage higher than its source voltage to the backgate of transistor Q4.

(4) Making the size of transistor Q4 larger than that of transistor $Q_{31}$.

From the standpoint of preventing an increase in the number of process steps and reducing costs, measures (2)–(4) are preferable.

(3) The leak current of P-type MOS transistor $Q_{31}$ is greater than the off current of P-type MOS transistor Q4.

As shown schematically in FIG. 13 (c), if the threshold voltage Vth of P-type MOS transistor $Q_{31}$ is reduced below that of P-type MOS transistor Q4 without applying a substrate bias effect to the P-type MOS transistor $Q_{31}$, the voltage-current characteristic of transistor $Q_{31}$ assumes the pattern shown in T4 in FIG. 11 (b), in which case the leak current IB at point F1 of VGS=0 v is greater than the off current IA at point E1 of the P-type MOS transistor Q4. However, since the current flowing in the serial circuit is equal to the value of the off current IA, transistor $Q_{31}$ is at point F2 of T4. Therefore, since the gate-source voltage VGS of transistor $Q_{31}$ is+a, the source voltage V7 (VP) is 3 v−(+a)=3 v−a.

Thus, by reducing the threshold voltage of transistor $Q_{31}$ below that of transistor Q4, the source voltage V7 (VP) can be set at a value less than 3 v. Beyond reducing the threshold voltage, as described above, the following measures can be taken in order to adjust the source voltage V7 (VP) to a value less than 3 v:

(1) Making the size of transistor Q4 smaller than that of transistor $Q_{31}$.

(2) Making the polysilicon gate size of transistor Q4 larger than that of transistor $Q_{31}$.

(3) Applying an electric potential less than its source electric potential to the backgate of transistor $Q_{31}$.

Measures (1) and (2) are preferable from the standpoint of the voltage tolerance protection of transistor Q4 and preventing a reduction in source voltage V7 (VP).

On the other hand, the source electric potential V11 of P-type MOS transistor $Q_{51}$ is determined by the sub-threshold, forward-direction current of the diode circuit (constant-current source), which is a serial connection of junction diodes and the leak current of the P-type MOS transistor $Q_{51}$. FIG. 12 (a) shows the voltage-current characteristic of one junction diode. The voltage-current characteristic can be divided into an "on" region, in which the diode is turned on when a voltage greater than the threshold (cut-in) voltage is applied to the area between the cathode and anode; and an "off" region, in which the diode is turned off when a voltage less than the threshold (cut-in) voltage is applied to the area between the cathode and anode. The voltage applied to both ends of diode circuit 8a is approximately 2 v. If the diode circuit is composed of three or more junction diodes, the voltage applied to both ends of each diode is divided, thus creating a sub-threshold condition (0 v−threshold voltage). Therefore, as indicated in FIG. 12 (a), by increasing the number of diodes the voltage between the cathode and anode, VCA, per diode becomes smaller due to the division, thus reducing the amount of sub-threshold current flowing to the diode circuit 8a. Now, assume that T5 in FIG. 12 (b) depicts the voltage-current characteristic of P-type MOS transistor $Q_{51}$. Point J1 of gate-source voltage VGS=0 v is the "off" current of P-type MOS transistor $Q_{51}$. If the sub-threshold current ICA flowing to the diode circuit 8a is D1, greater than leak current J1 of transistor $Q_{51}$, current D 1 also flows to transistor $Q_{51}$. In this case, the operating point of transistor $Q_{51}$ coincides with point J2, thus making the gate-source voltage VGS -β and the source electric potential V11 (3 v−(−β))=3 v+β. Conversely, if the sub-threshold current ICA flowing to the diode circuit 8a is D2, smaller than "off" current J1 of transistor $Q_{51}$, current D2 also flows to transistor $Q_{51}$. In this case, the operating point of transistor $Q_{51}$ coincides with point J3, thus making the gate-source voltage VGS+β and the source electric potential V11 (3 v−(+β))=3 v−β. By increasing the number of junction diodes in the diode circuit 8a, it is possible to reduce substantially the amount of sub-threshold current ICA flowing into diode circuit 8a. In this manner the source electric potential V11 can easily be adjusted to a value less than 3 v.

In the first through third embodiments, the source electric potential V7 (Vm) of transistor $Q_{31}$ ($Q_{41}$) determines both the drain voltage of transistor Q4 (Q3) and the gate voltage of transistor Q3 (Q4), due to the fact that these transistors are flip-flop configurations. The determination is made on the basis of a source follower. In actuality, however, as explained previously, the effects of the "off" current (leak current) of transistor Q4 (Q3) must be taken into consideration. However, a relatively high voltage should be added to the drain of an "on" state transistor Q4 (Q3) in order to maintain it within the low-voltage tolerance range, whereas the gate voltage amplitude of the transistor Q4 (Q3) should be increased (the gate voltage should be reduced) in order to utilize its transistor drive capacity. Therefore, this embodiment provides a non-flip-flop configuration in which transistor $Q_{31}$ assigns a high electric potential, V7, to the drain D of transistor Q4 in order to protect transistor Q4 from a voltage breakdown. On the other hand, transistor $Q_{51}$ assigns a low electric potential, V7 (=3 v −β), different from the high electric potential V7 (=3 v), to the gate G of transistor Q3 in order to increase the drive capacity of transistor Q3. The value of electric potential V7 (=3 v) can be reduced by minimizing the value of the sub-threshold current that flows into diode circuit 8a, and the sub-threshold current can be set easily by increasing the number of diodes. Thus, the smaller (approximately 3 v=3 v−β) the low level of the 0–3 v narrow logical amplitude, the greater is the electric potential difference between the gate and the source of transistors Q3 and Q4 and of transistor $Q_8$ in the output buffer circuit (3), thus improving the drive capacities of transistors in their on state. This ensures the generation of output signals with sufficiently high current capacities and contributes to an increase in the speed of circuits. By setting a value 3 v–$\beta \geq$ 2 v, i.e., $\beta \leq$ 1 v, the areas between the gate and source and between the gate and the substrate in transistors Q3, Q4, and $Q_8$ remain within the 3 v voltage tolerance range. To provide a weak current source, a P-type MOS transistor with a small channel width can be connected serially either between the source and the 5 v power line of transistor $Q_{51}$ or between the source and the 5 v power line of transistor $Q_{61}$, and either the source electric potential V11 of transistor $Q_{51}$ or the source Vm of transistor $Q_{61}$ can be applied to these gates. This configuration utilizes the "off" current of the MOS transistors. A serial circuit of negative load MOS transistors can also be used.

On the other hand, when the input signal Vin is 3 v, its inverted signal Vin (bar) is 0 v, as shown in FIG. 6. Consequently, the electric potential transmission transistor Q2 is off. Because the transmission of electric potential from transistor Q2 to the source S of transistor $Q_{21}$ does not occur, and, as will be described below, a 5 v electric potential is applied to the drain D of transistor $Q_{21}$ via the flip-flop FF, the transistor $Q_{21}$ forms a source follower circuit, thus causing the source voltage V4 of the transistor $Q_{21}$ to equal (3 v–VTHN), where VTHN denotes the threshold value voltage which is in effect when a back gate bias (0 v) is not applied in an N-type MOS transistor, and is expressed as an absolute value. It follows that the voltage between gate G and drain D of the transistor Q2 is 3 v–VTHN and the voltage between gate G and the substrate is 0 v. Therefore, when turned off, the transistor Q2 remains within the 3 v voltage tolerance range.

When the input signal Vin is 3 v, the gate voltage V11 of transistor $Q_3$ is 3 v–$\beta$, as described above, in which case transistor $Q_3$ is turned on and its drain voltage, i.e., mediator voltage Vm equals 5 v (the second high level). Because, for the transistor $Q_3$, the voltages between gate G and source S, between gate G and drain D, and between gate G and the substrate are 5 v –(3 v–$\beta$)=2 v+$\beta$, respectively, the transistor $Q_3$ remains within the 3 v voltage tolerance range. In this case the gate voltages of transistors $Q_{41}$ and $Q_{61}$ are 3 v, these transistors are turned on, and their drain voltage V6 equals 5 v. Because, for the transistors $Q_{41}$ and $Q_{61}$, the voltages between gate G and source S, between gate G and drain D, and between gate G and the substrate are 5 v–3 v=2 v, the transistors $Q_{41}$ and $Q_{61}$ remain within the 3 v voltage tolerance range. Further, the transmission of a 5 v voltage as an input into the drain D of the transistor $Q_{21}$ makes the transistor $Q_{21}$ a source follower, in which case the source electric potential V4 is equal to (3 v–VTHN). Because, for the transistor $Q_{21}$, the voltage between gate G and drain D is 5 v–3 v=2 v and the voltage between gate G and source S is 3 v–(3 v–VTHN)=VTHN, and the voltage between gate G and the substrate is 3 v, the transistor $Q_{21}$ remains within the 3 v voltage tolerance range. Further, when the source voltage of transistor $Q_{61}$ becomes 5 v, both the P-type MOS transistor Q4 and the P-type MOS transistor $Q_8$ of the output buffer circuit (3) are turned off. Therefore, for transistors Q4 and Q4 the voltages between gate G and source S, and between gate G and the substrate are 0 v, and because the voltage between gate G and drain D is 5 v–(3 v–$\beta$)=2 v+$\beta$, transistors Q4 and Q4 also remain within the 3 v voltage tolerance range.

Thus, when the input signal Vin is at 3 v (the first high level), the mediator signal Vm is at 5 v (the second high level). Under these conditions all the transistors that comprise the mediator signal generation circuit (2) are within the 3 v voltage tolerance range, where the transistor $Q_{21}$ contains the voltage application relaxation function, which reduces the voltage applied to the drain D of the transistor Q2 when the transistors Q3, $Q_{41}$, and $Q_{61}$ are turned on. If the transistor $Q_{21}$ does not exist, a 5 v voltage is directly applied to the drain D of the transistor Q2, which can cause the voltage breakdown of the gate insulator of the transistor Q2.

However, in this embodiment, when the transistor Q2 is off, the buffering effect of the transistor $Q_{21}$, which acts as a source follower, performs a 5 v–(3 v–VTHN)=2 v +VTHN voltage relaxation function with respect to the drain D of the transistor Q2, thus eliminating the voltage breakdown potential for transistor Q2. On the other hand, the transistors $Q_{31}$ and $Q_{51}$ perform the function of generating second low-level (approximately 3 v) signals V7 and V11 that are higher than the first low level (0 v) of a narrow logical amplitude, 0–3 v, thus eliminating the possibility of a voltage breakdown of the transistors Q3 and Q4. The reason is that if transistors $Q_{31}$ and $Q_{51}$ do not exist, an 0 v voltage is directly applied to the drain D of transistor Q4 and to the gate G of transistor Q3 when the transistors Q1 and $Q_{11}$ are turned on. This causes the addition of 5 v to the area between the gate and drain of the transistor Q4, and 5 v to the area between the gate and source of the transistor Q3, thus creating the possibility of voltage breakdown for transistors Q4 and Q3, whose voltage tolerance is 3 v. However, in this embodiment the buffering effect of voltage relaxation transistors $Q_{31}$ and $Q_{51}$ causes an increase in the drain voltage for transistor Q4 and the gate voltage of transistor Q3 from 0 v to approximately 3 v, thus reducing the voltage applied to transistors Q3 and Q4 and preventing their voltage breakdown.

When the input signal Vin is at 0 v, its inverted signal Vin (bar) becomes 3 v. However, because of the symmetry of the mediator signal generation circuit (2), the operations of transistors Q1, $Q_{11}$, $Q_{31}$, $Q_{51}$, and Q4 are the same as those of transistors Q2, $Q_{21}$, $Q_{41}$, $Q_{61}$, and Q3 when the input signal Vin is at 3 v. Similarly, the operations of transistors Q2, $Q_{21}$, $Q_{41}$, $Q_{61}$, and Q3 are the same as those of transistors Q1, $Q_{11}$, $Q_{31}$, $Q_{51}$, and Q4 when the input signal Vin is at 3 v. Therefore, the mediator signal Vm can be set to a value (3 v–$\beta$) lower than the gate voltage (3 v) that is applied to transistor $Q_{61}$. Consequently, the drive capacity of transistor Q4 in the "on" state and that of transistor $Q_8$ in the output buffer circuit (3) can be increased. Moreover, P-type MOS transistors with a small channel width can be connected serially between transistor $Q_{61}$ and the 5 v power line, and the source voltage V11 of transistor $Q_{51}$ can be applied to these gate terminals. Further, by setting the low level (3 v–$\beta$) of this narrow logical amplitude to 3 v–$\beta \geq$ 2 v, i.e., $\beta \leq$ 1 v, the areas between the gate and source, the gate and drain, and the gate and substrate of transistor Q4 and the transistor $Q_8$ in the output buffer circuit (3) can be regulated within the 3 v voltage tolerance range. Also, the transistor $Q_{11}$ performs a voltage relaxation of 5 v–(3 v–VTHN) with respect to the drain of the transistor Q1, thus preventing the voltage breakdown of the transistor Q1. Further, the transistors $Q_{41}$ and $Q_{61}$ increase the drain voltage of transistor Q3 and the gate voltage of transistor Q4 from 0 v to 3 v–$\beta$, thus relaxing the voltage applied to transistors Q3 and Q4 and preventing their voltage breakdown. The circuit configuration and operation of output buffer circuit (3), low-voltage power supply backup circuit (4), and timing circuit (5) in this embodiment are the same as those in the first embodiment of the present invention.

Fifth Embodiment

Figure 7:
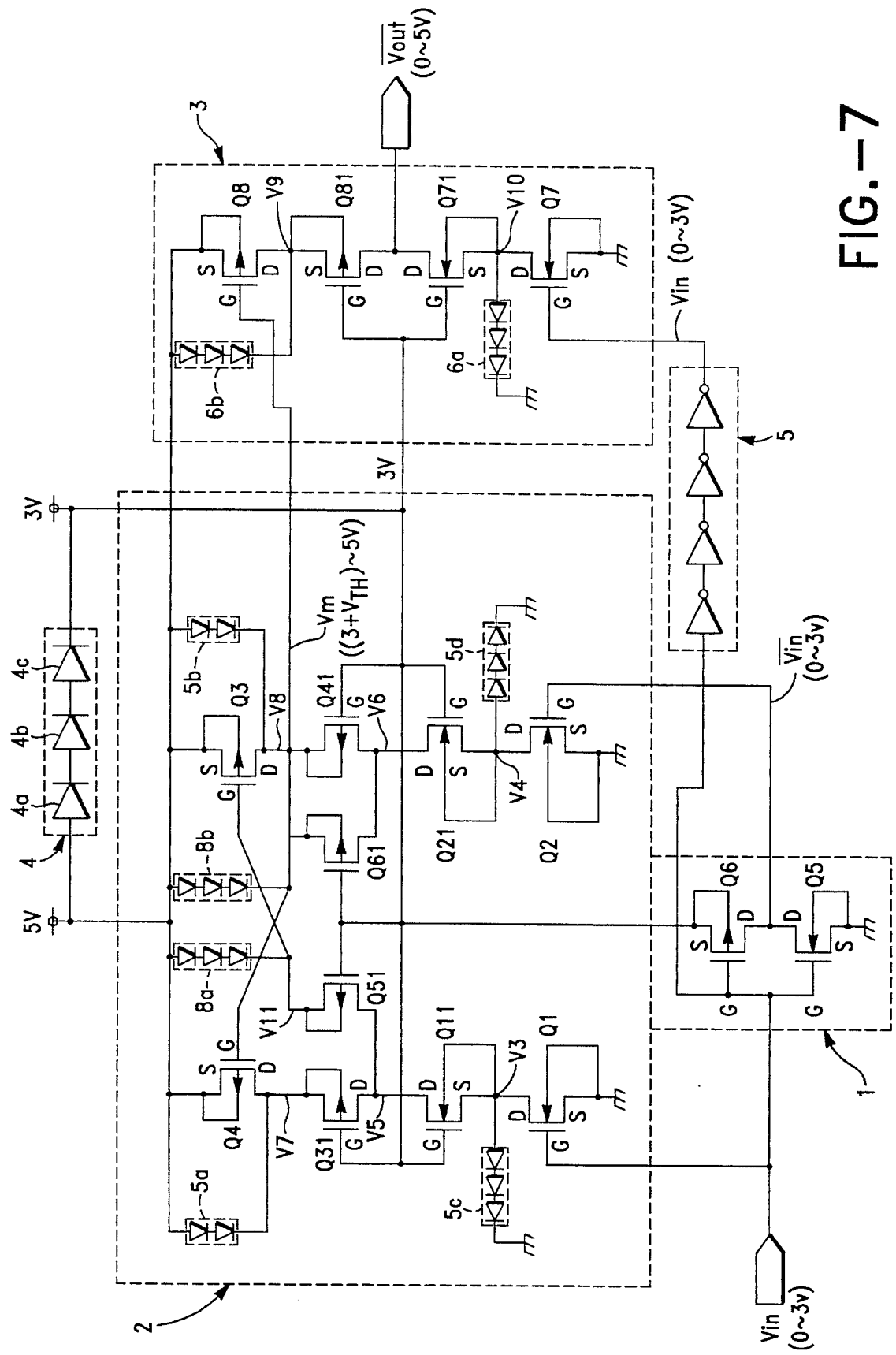
FIG. 7 is a circuit diagram of the signal voltage level conversion circuit for the fifth embodiment of the present invention.

FIG. 7 shows a circuit diagram for the fifth embodiment of the present invention.

In this fifth embodiment the same reference numbers are assigned to the components as are used in the fourth embodiment. An explanation of these identical components is omitted. Compared with the circuit configuration of the fourth embodiment (FIG. 5), this embodiment includes additional items of level-holding circuits 5a, 5b, and 6b as lower-bound limiters that inhibit the fall in electric potential in the second embodiment (FIG. 4); and level-holding circuits 6a, 5c, and 5d as upper-bound limiters that inhibit the rise in electric potential. If the level-holding circuit 5a does not exist between the 5 v power line and the source for transistor $Q_{31}$, when the transistor Q4 is turned off the source voltage V7 declines gradually due to the weak leak current of transistor $Q_{31}$. This eventually increases the voltage between the gate and drain of transistor Q4 to a level higher than 3 v, thus causing a potential voltage breakdown of transistor Q4. In this embodiment a level-holding circuit 5a, composed of a serial circuit of two junction diodes, is provided and its forward direction voltage (cut-in voltage= 0.8×2=1.6 v) keeps any decline in the low level of the source voltage V7 within a prescribed value (approximately 3.4 v) and maintains the low level at this value. This can prevent a voltage breakdown of transistor Q4. For the same reason, the level-holding circuit 5b inhibits any temporary decline in the low level of the mediator signal voltage Vm, thus preventing a voltage breakdown of transistor Q3. Although level-holding circuits 5a and 5b are located between the gate for transistors Q3 and Q4 and the 5 v power line, instead of this configuration one junction diode can be provided between the gate for transistors Q3 and Q4 and the 3 v power line. The level-holding voltage of this diode is approximately 2.2 v, capable of maintaining the transistors Q3 and Q4 within the 3 v voltage tolerance range. The use of a single junction diode minimizes the number of wells used in the semiconductor device.

On the other hand, the level-holding circuit 5c inhibits the rise in the electric potential V3 when the transistor Q1 is turned off. When the transistor Q1 is turned off, because the transistor $Q_{11}$ becomes a source follower, initially the electric potential V3 is (3 v–VTHN). Although this electric potential increases gradually due to a minute leak current, the rise in the electric potential is inhibited by the level-holding circuit 5c composed of the serial connection of three junction diodes (cut-in voltage=0.8×3=2.4 v), thus maintaining the transistor Q1 within the 3 v voltage tolerance range. Similarly, the level-holding circuit 5d inhibits the rise in the electric potential V4, thus preventing a voltage breakdown of the transistor Q2. Instead of providing a serial connection of three junction diodes between drain D and the ground line of transistors Q1 and Q2, one junction diode can be connected between drain D and the 3 v power line of transistors Q1 and Q2.

In this case any rise in the electric potentials V3 and V4 is arrested at approximately 3.8 v. Although in the strict sense the transistors Q1 and Q2 are not maintained in the 3 v voltage range, under the normal safety rate (approximately 4 v), this level of voltage tolerance should be sufficient. The low-voltage power supply used is 3 v in order to match the high level of a narrow logical amplitude. However, as noted above, although a power source voltage approximately 2.5 v is also acceptable, in this case the above limit voltage will be approximately 3.2 v. The use of one diode saves space in the semiconductor device area and prevents any waste of current on the ground side. Because the current can be reused on the low-voltage power source side, the power consumption can be reduced commensurably.

In the output buffer circuit (3), too, if a level-holding circuit 6a does not exist, the source voltage V10 of transistor $Q_{71}$ increases gradually due to the weak leak current of transistor $Q_{71}$ when the transistor Q7 is in the off state. This decreases the voltage between the gate and the source below the threshold voltage VTHN, thus causing the transistor $Q_{71}$ to turn off and increasing the drain electric potential of transistor $Q_{71}$. This leads to a potential voltage breakdown of transistor Q7. However, because the level-holding circuit 6a, composed of the serial connection of three junction diodes, is provided in this embodiment, the rise in source voltage V10 is kept within a prescribed value (approximately 2.4 v) by the forward-direction voltage (cut-in voltage) of the level-holding circuit, and the source voltage is maintained within this value. This prevents the transistor $Q_{71}$ from being turned on and any voltage breakdown of the transistor Q7. Further, the level-holding circuit 6b prevents the fall in voltage V9, and thus prevents a voltage breakdown of transistor Q8. Instead of providing a serial connection of three junction diodes between drain D and the ground line of transistor Q7, the level-holding circuit 6a can be constructed by connecting one junction diode between drain D and the 3 v power supply of transistor Q7. This saves both space in the semiconductor device area and power consumption. Similarly, the level-holding circuit 6b can be constructed by connecting one junction diode between drain D and the 3 v power supply of transistor Q8 in order to obtain the aforementioned advantages.

For the construction of level-holding circuits 5a, 5b, 6b, 6a, 5c, and 5d, serial circuits of MOS transistors and their threshold voltages can be used instead of diodes. In this manner upper or lower-bound voltage limiter means can be constructed.

Sixth Embodiment

Figure 8:
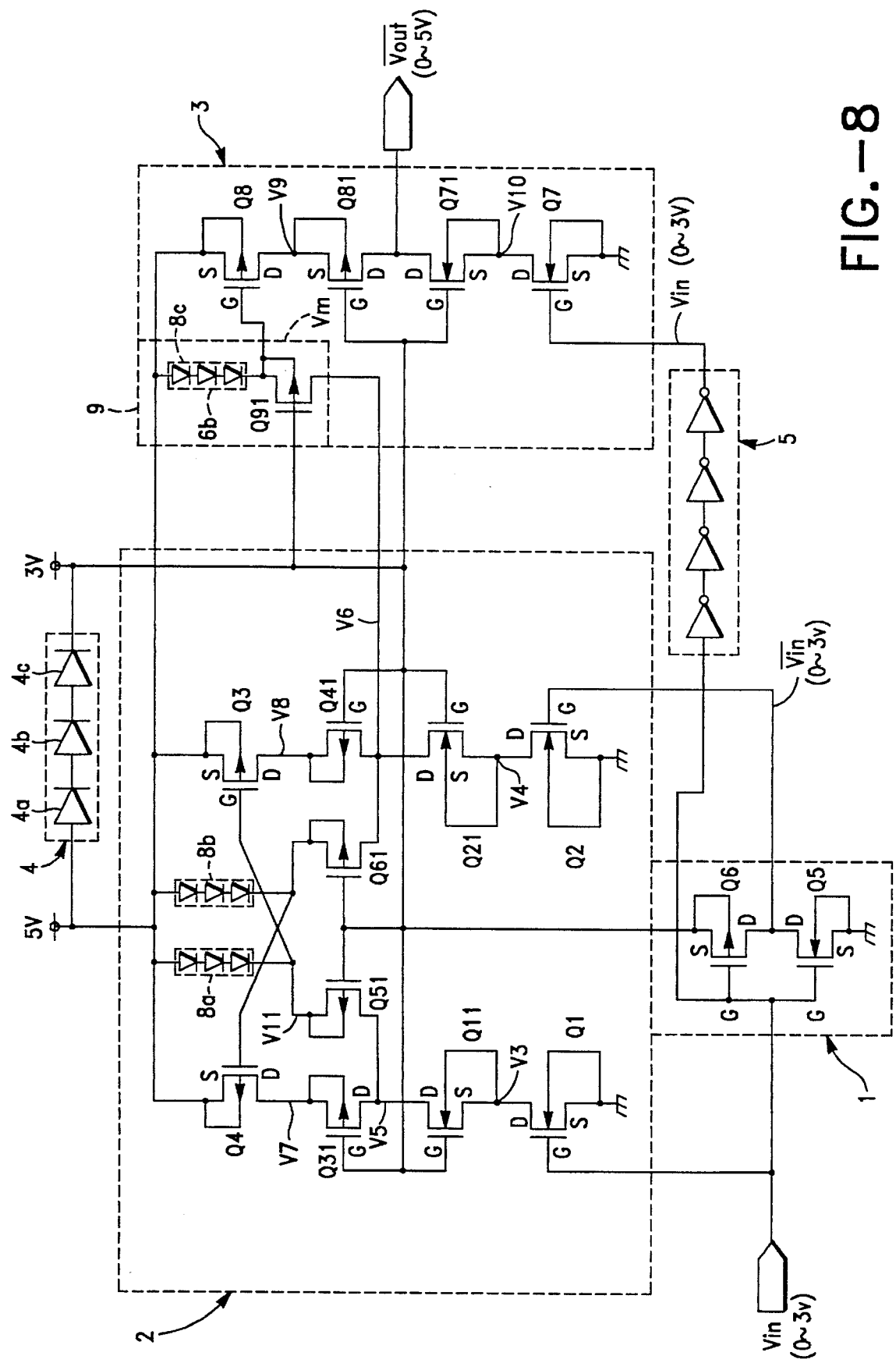
FIG. 8 is a circuit diagram of the signal voltage level conversion circuit for the sixth embodiment of the present invention.

FIG. 8 shows a circuit diagram for the sixth embodiment of the present invention.

Figure 9:
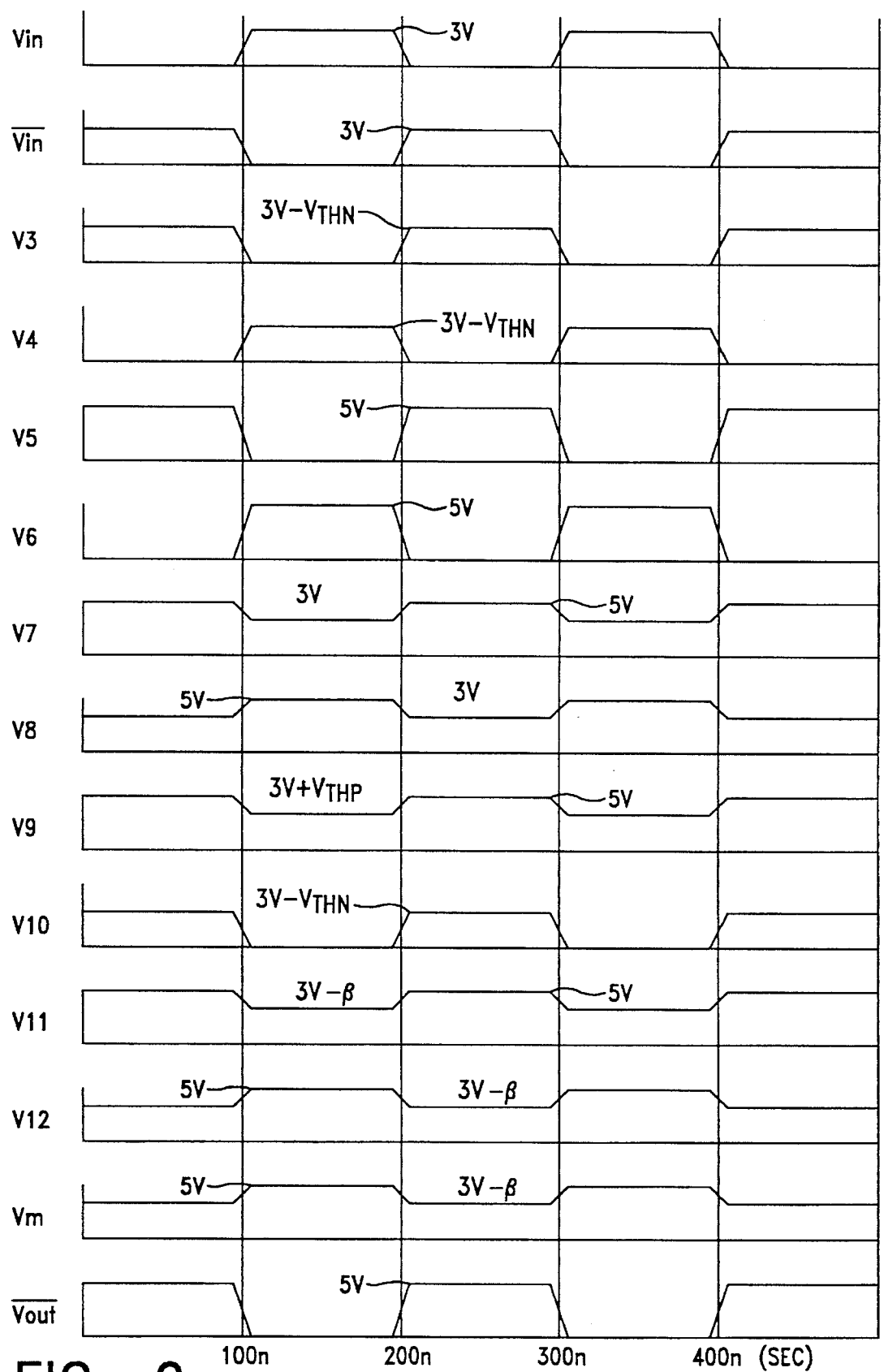
FIG. 9 is a timing chart showing the signal waveforms of the various components of the sixth embodiment of the present invention.

This embodiment provides the following circuit configuration in the circuit shown in FIG. 5 of the fourth embodiment: a buffer circuit that generates a logical amplitude that is defined as being between a low level (approximately 3 v) higher than the low level of the 0–3 v narrow logical amplitude due to the on/off actions of the second MOS transistor, and a level (5 v) virtually equal to the high level with a wide logical amplitude of 0–5 v, such that this buffer circuit is provided between a high-speed signal voltage level conversion circuit (2) and a large-current capacity output buffer circuit (3). FIG. 9 shows the signal waveforms of the components of this embodiment.

The circuit configuration shown in FIG. 5 of the fourth embodiment is smaller than transistor $Q_8$ of the output buffer circuit (3) and is suitable for use in situations where the required current capacity is not large. However, if the size of transistor $Q_8$ is increased in order to ensure a large current capacity for the output buffer circuit (3), the large transistor $Q_8$ will have a large electrostatic capacity. Then, the small transistor $Q_{61}$ in the mediator signal generation circuit (2) that drives transistor $Q_8$ requires a long charge/discharge time, thus detracting from the purpose of attaining a high-speed performance. If the size of transistor $Q_{61}$ is increased in order to solve this problem, the operating speed of transistor Q4 slows down, which makes it difficult to increase the speed of the mediator signal generation circuit (2). Thus, high speed and large current capacity present a dichotomy.

In this embodiment, however, a buffer circuit (9) is provided before the output buffer circuit (3). The buffer circuit (9) includes a P-type MOS transistor $Q_{91}$, parallel to transistor $Q_{61}$, and a diode circuit 8c, connected between the source and the 5 v power line. The P-type MOS transistor $Q_{91}$ performs the same function as transistor $Q_{61}$, and the source voltage Vm of P-type MOS transistor $Q_{91}$ is determined by the leak current of transistor $Q_{91}$ and the sub-threshold current of diode circuit 8c. Consequently, as in the case of the fourth embodiment, voltage Vm can be set to a value (3 v–β) lower than the gate voltage (3 v) that is applied to the P-type MOS transistor $Q_{91}$. The sub-threshold current of diode circuit 8c can be regulated easily by changing the number of diodes. Further, by setting the 0~3 v narrow logical amplitude level (3 v–β) due to the on/off actions of the second N-type transistor Q2 to (3 v–β≧2 v), the voltages between the gate and source, the gate and drain, and the gate and substrate for transistor $Q_8$ in the output buffer circuit (3) can be maintained within the 3 v voltage tolerance range.

This embodiment differs from the fourth embodiment in that the gate signal for transistor $Q_8$ in the output buffer circuit (3) is extracted through the buffer circuit (9) instead of directly from the mediator signal generation circuit (2). Although the extraction of an exceedingly large output current from the output buffer circuit (3) requires transistor $Q_8$, which has an extremely large channel width, the provision of the buffer circuit (3) can reduce the charge/discharge time of the large transistor $Q_8$.

Therefore, the transistors comprising the mediator signal generation circuit (2) can be small, and thus their performance speed can be increased. Alternatively, a negative load MOS configuration, in which P-type MOS transistors of a small channel width are connected serially between transistor $Q_{91}$ and the 5 v power line and the P-type MOS transistor $Q_{51}$ is connected to the gate terminals of these P-type MOS transistors, can be used. The "off" current of the MOS transistors can also be used.

Seventh Embodiment

Figure 10:
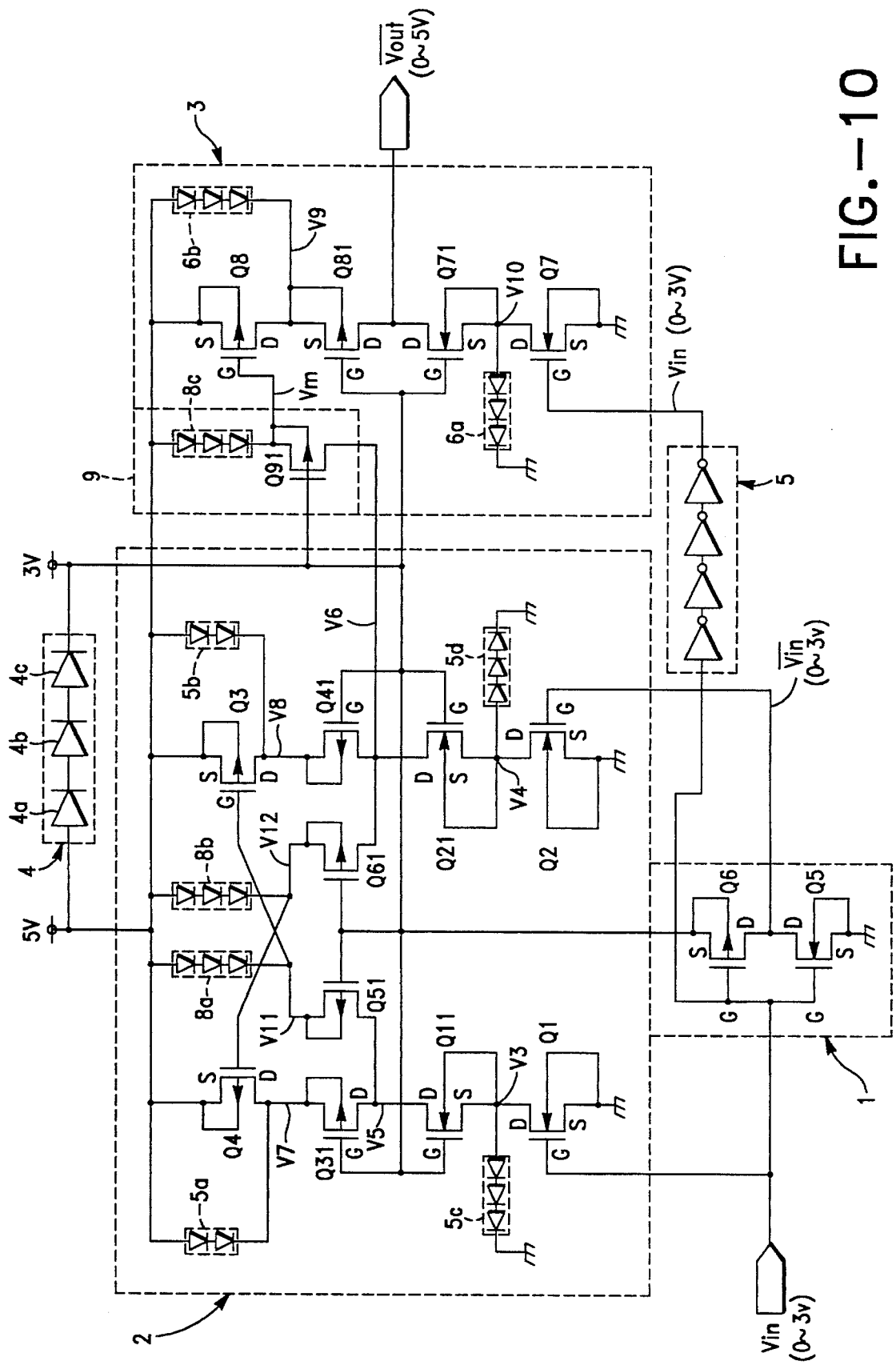
FIG. 10 is a circuit diagram of the signal voltage level conversion circuit for the seventh embodiment of the present invention.

FIG. 10 shows a circuit diagram for the seventh embodiment of the present invention.

In this seventh embodiment the identical reference numbers are assigned to the components as are used in the sixth embodiment. An explanation of these identical components is omitted. Compared with the circuit configuration of the sixth embodiment (FIG. 8), this embodiment contains the additional items of level-holding circuits 5a, 5b, and 6b as lower-bound limiters that inhibit the fall in electric potential in the second embodiment (FIG. 4), as well as level-holding circuits 6a, 5c, and 5d as upper-bound limiters that inhibit the rise in electric potential. If the level-holding circuit 5a does not exist between the 5 v power line of transistor $Q_{31}$ and the source, when the transistor Q4 is turned off, the source voltage V7 declines gradually due to the weak leak current of transistor $Q_{31}$. This eventually increases the voltage between the gate and drain of transistor Q4 to a level higher than 3 v, thus causing a potential voltage breakdown of transistor Q4. Therefore, in this embodiment a level-holding circuit 5a, composed of a serial circuit of two junction diodes, is provided, and its forward direction voltage (cut-in voltage=0.8×2=1.6 v) keeps any decline in the low level of the source voltage V7 within a prescribed value (approximately 3.4 v) and maintains the low level at this value. This can prevent a voltage breakdown of transistor Q4. For the same reason, the level-holding circuit 5b inhibits any temporary decline in the low level of the source voltage V8, thus preventing a voltage breakdown of transistor Q3. Although level-holding circuits 5a and 5b are located between the gate and the 5 v power line of transistors Q3 and Q4, instead of this configuration one junction diode can be provided between the gate and the 3 v power line of transistors Q3 and Q4. The level-holding voltage of this diode is approximately 2.2 v, capable of maintaining the transistors Q3 and Q4 within the 3 v voltage tolerance range. The use of a single junction diode minimizes the number of wells used in the semiconductor device.

On the other hand, the level-holding circuit 5c inhibits the rise in the electric potential V3 when the transistor Q1 is turned off. Because the transistor $Q_{11}$ becomes a source follower when the transistor Q1 is turned off, initially the electric potential V3 is (3 v–VTHN). Although this electric potential increases gradually due to a minute leak current, the rise in the electric potential is inhibited by the level-holding circuit 5c composed of the serial connection of three junction diodes (cut-in voltage =0.8×3=2.4 v), thus maintaining the transistor Q1 within the 3 v voltage tolerance range. Similarly, the level-holding circuit 5d inhibits the rise in the electric potential V4, thus preventing a voltage breakdown of the transistor Q2. Instead of providing a serial connection of three junction diodes between drain D and the ground line of transistors Q1 and Q2, one junction diode can be connected between drain D and the 3 v power line of transistors Q1 and Q2.

In this case any rise in the electric potentials V3 and V4 is arrested at approximately 3.8 v. Although in the strict sense the transistors Q1 and Q2 are not maintained in the 3 v voltage range, under the normal safety rate (approximately 4 v), this level of voltage tolerance should be sufficient. The low-voltage power supply used is 3 v in order to match the high level of a narrow logical amplitude. However, as noted above, since a power source voltage approximately 2.5 v is also acceptable, in this case the above limit voltage will be approximately 3.2 v. The use of one diode saves space in the semiconductor device area and prevents any waste of current on the ground side. Because the current can be reused on the low-voltage power source side, the power consumption can be reduced commensurably.

In the output buffer circuit (3), too, if a level-holding circuit 6a does not exist, the source voltage V10 of transistor $Q_{71}$ increases gradually due to the weak leak current of transistor $Q_{71}$ when the transistor $Q_7$ is in the off state. This decreases the voltage between the gate and the source below the threshold voltage VTHN, thus causing the transistor $Q_{71}$ to turn off and increasing the drain electric potential of transistor $Q_{71}$. This leads to a potential voltage breakdown of transistor $Q_7$. However, because the level-holding circuit 6a, composed of the serial connection of three junction diodes, is provided in this embodiment, the rise in source voltage V10 is kept within a prescribed value (approximately 2.4 v) by the forward-direction voltage (cut-in voltage) of the level-holding circuit, and the source voltage is maintained within this value. This prevents the transistor $Q_{71}$ from being turned off and any voltage breakdown of the transistor $Q_7$. Further, the level-holding circuit 6b prevents a fall in voltage V9, and thus prevents a voltage breakdown of transistor $Q_8$. Instead of providing a serial connection of three junction diodes between drain D and the ground line of transistor $Q_7$, the level-holding circuit 6a can also be constructed by connecting one junction diode between drain D and the 3 v power supply of transistor $Q_7$. This saves both space in the semiconductor device area and power consumption. Similarly, the level-holding circuit 6b can be constructed by connecting one junction diode between drain D and the 3 v power supply of transistor $Q_8$ in order to obtain the aforementioned advantages.

For the construction of level-holding circuits 5a, 5b, 6b, 6a, 5c, and 5d, serial circuits of MOS transistors and their threshold voltages can be used instead of diodes. In this manner upper or lower-bound voltage limiter means can be constructed.

As explained above, this invention is characterized in that it provides voltage application relaxation means at various locations of the signal voltage level conversion circuit and produces the following unique effects:

(1) In the first flip-flop fundamental means, the first voltage application relaxation means relaxes the application of voltage to the second, second conductivity-type MIS transistor and simultaneously adds the relaxed voltage to the gate of the first, second conductivity-type MIS transistor. Similarly, the second voltage application relaxation means relaxes the application of voltage to the second, first conductivity-type MIS transistor. On the other hand, when the second, first conductivity-type MIS transistor is turned on, the second voltage application relaxation means adds the relaxed voltage to the gate of the second, second conductivity-type MIS transistor while relaxing the application of voltage to the first, second conductivity-type MIS transistor. Similarly, the first voltage application relaxation means relaxes the application of voltage to the first, first conductivity-type MIS transistor. Thus, because the voltage added to the transistors is inhibited by the first and second voltage application relaxation means, all transistors that are used in the signal voltage level conversion circuit can be maintained within a low-voltage tolerance range. This simplifies the semiconductor fabrication process and can offer low-cost signal voltage level conversion circuits.

(2) The second fundamental means uses a non-flip-flop configuration different from the configuration used in the first fundamental means. When the first, first conductivity-type MIS transistor is turned on, the first, second conductivity-type MIS transistor Q3) is turned on. Similarly, when the second, first conductivity-type MIS transistor is turned on, the second, second conductivity-type MIS transistor Q4) is turned on. In this case, the third voltage application relaxation means acts on the first, second conductivity-type MIS transistor, and the fourth voltage application relaxation means on the second, second conductivity-type MIS transistor, each one independently. By using these individual voltage relaxation means, the voltage applied to each transistor can be regulated in an optimal manner.

(3) The constant-current source for a voltage application relaxation means can be constructed, using a diode circuit composed of a serial connection of junction diodes in a sub-threshold state, so that voltage relaxation control can be performed using the sub-threshold current and the leak current from transistors. Because the sub-threshold current level can be determined by the number of junction diodes, this method offers an excellent control capability.

(4) Level fluctuations can be clamped into a specified value by providing lower-and upper-bound limiter means. In this manner the MIS transistors can be maintained within a low-voltage tolerance range.

(5) By providing a low-voltage power backup means, a low-voltage power supply can be generated automatically from a high-voltage power line when a low-voltage power supply is not available. Thus, even during non-availability of a low-voltage power supply transistors can be maintained within a low-voltage tolerance range.

(6) Further, by providing a timing circuit, the condition of both low-level and high-level electric potential transmission transistors in the output buffer circuit being turned on can be prevented. This eliminates the through current and thus helps to reduce power consumption.

(7) Although a single output buffer circuit can be used to produce output signals of a wide logical amplitude based on the first input signal of a narrow logical amplitude and the second input signal of a narrow logical amplitude, the presence of the first voltage application relaxation means relaxes the application of voltage to the first conductivity-type transistor for the transmission of a low-level electric potential when the first conductivity-type transistor for the transmission of a low-level electric potential is off and the second conductivity-type transistor for the transmission of a high-level electric potential is on. Conversely, the first voltage application relaxation means relaxes the application of voltage to the second conductivity-type transistor for the transmission of a high-level electric potential when the first conductivity-type transistor for the transmission of a low-level electric potential is on and the second conductivity-type transistor for the transmission of a high-level electric potential is off. Therefore, these two transistors can always be kept within the low-voltage tolerance range.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A signal voltage level conversion circuit, comprising:

inverter means for receiving an input signal having a first logical amplitude defined by a first level and a second level higher than the first level and for generating an inverted input signal;

mediator signal generation means for receiving said input signal and the inverted input signal and for generating a mediator signal having a second logical amplitude defined by a third level which is higher than the second level and a fourth level which is higher than the third level; and output buffer means for receiving said input signal and said mediator signal and for generating an output signal having a third logical amplitude defined by the first level and the fourth level.

2. The conversion circuit of claim 1, wherein said mediator signal generation circuit comprises:

a first MIS transistor of a first conductivity type whose on and off states are controlled by said input signal, said first transistor having one of its source and drain electrodes connected to a first power supply terminal;

a second MIS transistor of a first conductivity type whose on and off states are controlled by said inverted input signal, said second transistor having one of its source and drain electrodes connected to the first power supply terminal;

a third MIS transistor of a second conductivity type, said third transistor having one of its source and drain electrodes connected to a second power supply terminal;

a fourth MIS transistor of a second conductivity type, said fourth transistor having one of its source and drain electrodes connected to the second power supply terminal, wherein the conductive state of said third MIS transistor is controlled according to the potential of the other electrode of the source and drain electrodes of said fourth MIS transistor, and the conductive state of said fourth MIS transistor is controlled according to the potential of the other electrode of the source and drain electrodes of said third MIS transistor;

first voltage application relaxation means coupled between the other electrode of the source and drain electrodes of said first transistor and the other electrode of the source and drain electrodes of said fourth transistor for relaxing the application of voltage to either one of said first and fourth transistors whichever is in off state; and second voltage application relaxation means coupled between the other electrode of the source and drain electrodes of said second transistor and the other electrode of the source and drain electrodes of said third transistor for relaxing the application of voltage to either one of said second transistor and third transistors whichever is in off state.

3. The conversion circuit of claim 2, wherein said first voltage application relaxation means includes a fifth MIS transistor of the first conductivity type and a sixth MIS transistor of the second conductivity type serially coupled together, with said fifth transistor being serially coupled to said first transistor and said sixth transistor being serially coupled to said fourth transistor, said fifth and sixth transistors having their gate electrodes coupled to a third power supply terminal having a potential in a range between the potentials of the first and second power supply terminals; and wherein said second voltage application relaxation means includes a seventh MIS transistor of the first conductivity type and an eighth MIS transistor of the second conductivity type serially coupled together, said seventh transistor being serially coupled to said second transistor and said eighth transistor being serially coupled to said fifth transistor, said seventh and eighth transistors having their gate electrodes coupled to the third power supply terminal.

4. The conversion circuit of claim 3, wherein said mediator signal generation means further includes a first lower-bound limiting means for limiting the fall in the electric potential at the junction point of said fourth transistor and said sixth transistor and a second lower-bound limiting means for limiting the fall in the electrical potential at the junction point of said third transistor and said eighth transistor.

5. The conversion circuit of claim 3, wherein the OFF current of said fourth transistor at its off state is less than the OFF current of said sixth transistor at its off state.

6. The conversion circuit of claim 5, wherein the substrate of said sixth transistor is connected to the source electrode of said sixth transistor, and the substrate of said eighth transistor is connected to the source electrode of said eighth transistor.

7. The conversion circuit of claim 5, wherein the size of said sixth transistor is larger than the size of said fourth transistor.

8. The conversion circuit of claim 5, wherein the threshold voltage of said sixth transistor is lower than the threshold voltage of said fourth transistor.

9. The conversion circuit of claim 5, wherein the substrate voltage of said sixth transistor is lower than the substrate voltage of said fourth transistor, and the substrate voltage of said eighth transistor is lower than the substrate voltage of said third transistor.

10. The conversion circuit of claim 1, wherein said mediator signal generation means comprises:

a first MIS transistor of a first conductivity type in which one of its source and drain electrodes is connected to a first power supply terminal and whose on/off state is controlled by said input signal; and a second MIS transistor of a first conductivity type in which one of its source and drain electrodes is connected to the first power supply terminal and whose on/off state is controlled by said inverted input signal;

first voltage application relaxation means which is connected to the other electrode of the source and drain electrodes of said first transistor;

second voltage application relaxation means which is connected to the other electrode of the source and drain electrodes of said second transistor;

a third MIS transistor of a second conductivity type in which one of its source and drain electrodes is connected to a second power supply terminal, in which the other electrode of its source and drain electrodes is connected to said second voltage application relaxation means, and in which its gate electrode is connected to said first voltage application relaxation means; and a fourth MIS transistor of a second conductivity type in which one of its source and drain electrodes is connected to the second power supply terminal in which the other electrode of its source and drain electrodes is connected to said first voltage application relaxation means, and in which its gate electrode is connected to said first voltage application relaxation means;

wherein said first voltage application relaxation means relaxes the application of voltage to either one of said first and fourth transistors which is in the off state; and said second voltage application relaxation means relaxes the application of voltage to either one of said second and third transistors which is in the off state.

11. The conversion circuit of claim 10, wherein said first voltage relaxation means comprises:

a fifth MIS transistor of a first conductivity type, in which one of its source and drain electrodes is connected to the other electrode of the source and drain electrodes of said first transistor; and a sixth MIS transistor of a second conductivity type which is connected between the other electrode of the source and drain electrodes of said fifth transistor and the other electrode of the source and drain electrodes of said fourth transistor, wherein said fifth and sixth transistors have their gate electrodes connected to the third power supply terminal having a potential in a range between the potentials of said first and second power supply terminals;

said second voltage relaxation means comprises:

a seventh MIS transistor of a first conductivity type, in which one of its source and drain electrodes is connected to the other electrode of the source and drain electrodes of said second transistor; and an eighth MIS transistor of a second conductivity type, which is connected between the other electrode of the source and drain electrodes of said seventh transistor and the other electrode of the source and drain electrodes of said third transistor, wherein said seventh and eighth transistors have their gate electrodes connected to the third power supply terminal;

wherein the gate electrode of said third transistor is connected to a junction point of said sixth transistor and said fourth transistor, and the gate electrode of said fourth transistor is connected to a junction point for said eighth transistor and said third transistor.

12. The conversion circuit of claim 10, wherein
said first voltage relaxation means comprises:
a fifth MIS transistor of a first conductivity type, in which one of its source and drain electrodes is connected to the other electrode of the source and drain electrodes of said first transistor; a sixth MIS transistor of a second conductivity type, which is connected between the other electrode of the source and drain electrodes of said fifth transistor and the other electrode of the source and drain electrodes of said fourth transistor; and a ninth MIS transistor of a second conductivity type, in which the junction point between said fifth transistor and said sixth transistor is connected to one of the source and drain electrodes of the ninth transistor, wherein said fifth, sixth and ninth transistors have their gate electrodes connected to the third power supply terminal have a potential in a range between the potentials of the first and second power supply terminals;
said second voltage relaxation means comprises:
a seventh MIS transistor of a first conductivity type, in which one of its source and drain electrodes is connected to the other electrode of the source and drain electrodes of said second transistor; an eighth MIS transistor of a second conductivity type, which is connected between the other electrode of the source and drain electrodes of said seventh transistor and the other electrode of the source and drain electrodes of said third transistor; and a tenth MIS transistor of a second conductivity type, in which a junction point between said seventh transistor and said eighth transistor is connected to one of the source and drain electrodes of the tenth transistor, wherein said seventh, eighth and tenth transistors have their gate electrodes connected to the third power supply terminal,
wherein the gate electrode of said third transistor is connected to the other electrode of said ninth transistor, and
the gate electrode of said fourth transistor is connected to the other electrode of said tenth transistor.

13. The conversion circuit of claim 1, further comprising a low-voltage power supply backup means, coupled between a high-voltage power supply and a low-voltage power supply, for generating a low-voltage from the high-voltage power supply.

14. The conversion circuit of claim 13, wherein said low-voltage power supply backup means includes a voltage-fall circuit composed of a plurality of junction diodes serially connected together.

15. The conversion circuit of claim 13, wherein said mediator signal generation means further includes a first upper-bound limiting means for limiting the rise in the electric potential at the junction point of said first transistor and said fifth transistor and a second lower-bound limiting means for limiting the rise in the electrical potential at the junction point of said second transistor and said seventh transistor.

16. The conversion circuit of claim 1, further comprising timing circuit means for delaying the phases of said input signal relative to said mediator signal for providing to said output buffer means.

17. The conversion circuit of claim 1, wherein said output buffer means includes:
a first MIS transistor of a first conductivity type whose one and off states are controlled by said input signal said first transistor having one of its source and drain electrodes connected to a first power supply terminal; and
a second MIS transistor of a second conductivity type whose on and off states are controlled by said mediator signal, said second transistor having one of its source and drain electrodes connected to a second power supply terminal;
first voltage application relaxation means, serially coupled between the first and second MIS transistors, for relaxing the application of voltage to either one of the first and second transistors whichever is in off state.

18. The conversion circuit of claim 17, wherein said first voltage application relaxation means includes a third MIS transistor of the first conductivity type and a fourth MIS transistor of the second conductivity type serially coupled together with said third transistor being serially coupled to said first transistor and said fourth transistor being serially coupled to said second transistor, said third and fourth transistors having their gate electrodes coupled to a third power supply terminal having a potential in a range between the potentials of the first and second power supply terminals.

19. The conversion circuit of claim 17, wherein said output buffer means further includes lower-bound limiting means for limiting the fall in the electric potential at the junction point of said second transistor and said fourth transistor.

20. The conversion circuit of claim 17, wherein said output buffer means further includes upper-bound limiting means for limiting the rise in the electric potential at the junction point of said first transistor and said third transistor.

21. The conversion circuit of claim 1, wherein said mediator signal generation circuit comprises:
a first MIS transistor of a first conductivity type whose on and off states are controlled by said input signal, said first transistor having one of its source and drain electrodes connected to a first power supply terminal;
a second MIS transistor of a first conductivity type whose on and off states are controlled by said inverted input signal, said second transistor having one of its source and drain electrodes connected to the first power supply terminal;
a third MIS transistor of a second conductivity type, said third transistor having one of its source and drain electrodes connected to a second power supply terminal;
a fourth MIS transistor of a second conductivity type, said fourth transistor having one of its source and drain electrodes connected to the second power supply terminal;
first voltage application relaxation means coupled between the other electrode of the source and drain electrodes of said first transistor and the other electrode of the source and drain electrodes of said fourth transistor for relaxing the application of voltage to either one of said first and fourth transistors whichever is in off state;
second voltage application relaxation means coupled between the other electrode of the source and drain electrodes of said second transistor and the other electrode of the source and drain electrodes of said third transistor for relaxing the application of voltage to either one of said second and third transistors whichever is in off state;
third voltage application relaxation means, coupled between the second power supply terminal and said first voltage application means, for relaxing the application of voltage to a gate electrode of said third transistor when said input signal is at the second level that causes said first transistor to be in the on state; and fourth voltage application relaxation means, coupled between the second power supply terminal and said second voltage application means, for relaxing the application of voltage to a gate electrode of said fourth transistor when said input signal is at the first level that causes said second transistor to be in the on state.

22. The conversion circuit of claim 21, wherein said first voltage application relaxation means includes a fifth MIS transistor of the second conductivity type serially coupled together, with said fifth transistor being serially coupled to said first transistor and said sixth transistor being serially coupled to said fourth transistor, said fifth and sixth transistor having their gate electrodes coupled to a third power supply terminal having a potential in a range between the potentials of the first and second power supply terminals;

wherein said second voltage application relaxation means includes a seventh MIS transistor of the first conductivity type and an eighth MIS transistor of the second conductivity type serially coupled together, said seventh transistor being serially coupled to said second transistor and said eighth transistor being serially coupled to said fifth transistor, said seventh and eighth transistors having their gate electrodes coupled to the third power supply terminal;

wherein said third voltage application relaxation means includes a ninth MIS transistor of the second conductivity type and a first constant-current source providing a small amount of current thereto, said ninth transistor being coupled between a junction point of said fifth and sixth transistors and a gate electrode of said third transistor, said ninth transistor having a gate electrode coupled to the third power supply terminal, said first constant-current source being connected between the second power supply terminal and the gate electrode of said third transistor; and wherein said fourth voltage application relaxation means includes a tenth MIS transistor of the second conductivity type and a second constant-current source providing a small amount of current thereto, said tenth transistor being coupled between a junction point of said seventh and eighth transistor and a gate electrode of said fourth transistor, said tenth transistor having a gate electrode coupled to the third power supply terminal, said second constant-current source being connected between said second power supply terminal and the gate electrode of said fourth transistor.

23. The conversion circuit of claim 22, wherein said first and second constant current power sources each include a plurality of serially coupled junction diodes in a sub-threshold state.

24. The conversion circuit of claim 21, wherein said output buffer means includes:

a first MIS transistor of a first conductivity type whose on and off states are controlled by said input signal, said first transistor having one of its source and drain electrodes connected to a first power supply terminal; and a second MIS transistor of a second conductivity type whose on and off states are controlled by said mediator signal, said second transistor of said output buffer means having one of its source and drain electrodes connected to a second power supply terminal; and fifth voltage application relaxation means, serially coupled between the first and second MIS transistors of said output buffer means, for relaxing the application of voltage to either one of the first and second transistors of said output buffer means whichever is in off state.

25. The conversion circuit of claim 24, wherein said fifth voltage application relaxation means of said output buffer means includes a third MIS transistor of the first conductivity type and a fourth MIS transistor of the second conductivity type serially coupled together, with said third transistor of said output buffer means being serially coupled to said first transistor of said output buffer means and said fourth transistor of said output buffer means being serially coupled to said second transistor of said output buffer means, said third and fourth transistors of said output buffer means having their gate electrodes coupled to a third power supply terminal having a potential in a range between the potentials of the first and second power supply terminals.

26. The conversion circuit of claim 24 further comprising timing circuit means for delaying the phases of said input signal relative to said mediator signal for providing to said output buffer means.

27. The conversion circuit of claim 24, wherein said output buffer means further includes a sixth voltage application relaxation means, coupled to said mediator signal generation means for relaxing the application of voltage to a gate electrode of said second transistor of said output buffer means.

28. The conversion circuit of claim 27, wherein said sixth voltage application relaxation means of said output buffer means includes an MIS transistor and a constant-current source providing a small amount of current thereto, with said MIS transistor having a gate electrode coupled to the first power supply terminal and being coupled to said fourth voltage application relaxation means of said mediator signal generation means.

29. The conversion circuit of claim 28, wherein said constant-current power source of said sixth voltage application relaxation means of said output buffer means include a plurality of serially coupled junction diodes in a sub-threshold state.

30. An output buffer circuit receiving a first input signal and a second input signal and generating an output signal, the first input signal having a first logical amplitude defined by a first level and a second level higher than the first level, the second input signal having a second logical amplitude defined by a third level which is higher than the second level and a fourth level which is higher than the third level, the output signal having a third logical amplitude defined by the first level and the fourth level, the buffer circuit comprising:

a first MIS transistor of a first conductivity type whose on and off states are controlled by said input signal, said first transistor having one of its source and drain electrodes connected to a first power supply terminal; and a second MIS transistor of a second conductivity type whose on and off states are controlled by said second input signal, said second transistor having one of its source and drain electrodes connected to a second power supply terminal; and first voltage application relaxation means, serially coupled between the first and second MIS transistors, for relaxing the application of voltage to either one of the first and second transistors whichever is in off state.

31. The buffer circuit of claim 30, wherein said first voltage application relaxation means includes a third MIS transistor of the first conductivity type and a fourth MIS transistor of the second conductivity type serially coupled together, with said third transistor being serially coupled to said first transistor and said fourth transistor being serially coupled to said second transistor, said third and fourth transistors having their gate electrodes coupled to a third power supply terminal having a potential in the range between the potentials of the first and second power supply terminals.

32. The buffer circuit of claim 23, further comprising a second voltage application relaxation means for relaxing the application of voltage to a gate electrode of said second transistor.

33. The buffer circuit of claim 32, wherein said second voltage application relaxation means includes an MIS transistor and a constant-current source providing a small amount of current thereto, with said MIS transistor having a gate electrode coupled to the first power supply terminal and providing the second input signal.

34. The buffer circuit of claim 33, wherein said constant-current power source includes a plurality of serially coupled junction diodes in a sub-threshold state.

35. The buffer circuit of claim 31, further comprising lower-bound limiting means for limiting the fall in the electric potential at the junction point of said second transistor and said fourth transistor.

36. The buffer circuit of claim 31, wherein said output buffer means further includes upper-bound limiting means for limiting the rise in the electric potential at the junction point of said first transistor and said third transistor.

37. The buffer circuit of claim 31, wherein said third MIS transistor is substrate biased.

38. The buffer circuit of claim 31, wherein said fourth MIS transistor is substrate biased.

* * * * *